(12) United States Patent
Koyama

(10) Patent No.: US 8,284,127 B2
(45) Date of Patent: *Oct. 9, 2012

(54) DISPLAY DEVICE AND METHOD OF DRIVING THE SAME

(75) Inventor: Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 400 days.

This patent is subject to a terminal disclaimer.

(21) Appl. No.: 12/558,619

(22) Filed: Sep. 14, 2009

(65) Prior Publication Data

US 2010/0001930 A1    Jan. 7, 2010

Related U.S. Application Data

(63) Continuation of application No. 10/924,775, filed on Aug. 25, 2004, now Pat. No. 7,609,236, and a continuation of application No. 09/924,610, filed on Aug. 9, 2001, now Pat. No. 6,828,950.

(30) Foreign Application Priority Data

Aug. 10, 2000    (JP) .................................. 2000-243272

(51) Int. Cl.
   *G09G 3/30*    (2006.01)
(52) U.S. Cl. .............................. 345/76; 345/77; 345/204
(58) Field of Classification Search ............... 345/76–82, 345/204–206, 211, 212, 690
See application file for complete search history.

(56) References Cited

U.S. PATENT DOCUMENTS

| | | |
|---|---|---|
| 5,247,190 A | 9/1993 | Friend |
| 5,399,502 A | 3/1995 | Friend |
| 5,748,160 A | 5/1998 | Sheih et al. |
| 5,893,730 A | 4/1999 | Yamazaki |
| 5,910,792 A | 6/1999 | Hansen |
| 5,990,629 A | 11/1999 | Yamada |
| 6,020,865 A | 2/2000 | Okuda et al. |
| 6,061,041 A | 5/2000 | Yoshida |
| 6,083,801 A | 7/2000 | Ohtani |
| 6,097,302 A | 8/2000 | Zinzell |
| 6,160,272 A | 12/2000 | Arai et al. |

(Continued)

FOREIGN PATENT DOCUMENTS

EP    0 762 374 A1    3/1997

(Continued)

OTHER PUBLICATIONS

Schenk et al.; "Polymers for Light Emitting Diodes"; *Euro Display Proceedings*; pp. 33-37; 1999.

*Primary Examiner* — Duc Dinh
(74) *Attorney, Agent, or Firm* — Fish & Richardson P.C.

(57) ABSTRACT

A display is conducted by using a time gray-scale system, in which one frame period is divided into a plurality of sub-frame periods, and a voltage applied to an EL element of a pixel is varied on a sub-frame period basis. Because of this, a display device is provided in which the fluctuations in brightness caused by an environment temperature of an EL element are suppressed with a gray-scale display method that is unlikely to be influenced by variations in characteristics of TFTs in a pixel portion and that is unlikely to be influenced by variations in a display period.

30 Claims, 19 Drawing Sheets

U.S. PATENT DOCUMENTS

| | | |
|---|---|---|
| 6,268,617 B1 | 7/2001 | Hirakata |
| 6,376,994 B1 | 4/2002 | Ochi |
| 6,380,558 B1 | 4/2002 | Yamazaki |
| 6,384,818 B1 | 5/2002 | Yamazaki |
| 6,396,466 B1 * | 5/2002 | Pross et al. ............... 345/82 |
| 6,424,321 B1 | 7/2002 | Ronzani |
| 6,424,326 B2 | 7/2002 | Yamazaki |
| 6,452,576 B1 | 9/2002 | Van Velzen |
| 6,478,263 B1 | 11/2002 | Yamazaki |
| 6,518,962 B2 * | 2/2003 | Kimura et al. ............ 345/211 |
| 6,528,820 B1 | 3/2003 | Yamazaki |
| 6,528,951 B2 | 3/2003 | Yamazaki |
| 2001/0033252 A1 | 10/2001 | Yamazaki |
| 2002/0125831 A1 | 9/2002 | Inukai |
| 2003/0132716 A1 | 7/2003 | Yamazaki |

FOREIGN PATENT DOCUMENTS

| | | |
|---|---|---|
| JP | 09-101759 A | 4/1997 |
| JP | 09-138659 A | 5/1997 |
| JP | 10-232649 A | 9/1998 |
| JP | 10-92576 | 4/1999 |
| JP | 11-272223 A | 10/1999 |
| WO | WO 90/13148 | 11/1990 |
| WO | 98/33165 A1 | 7/1998 |

* cited by examiner $T_1 > T_2 > T_3$

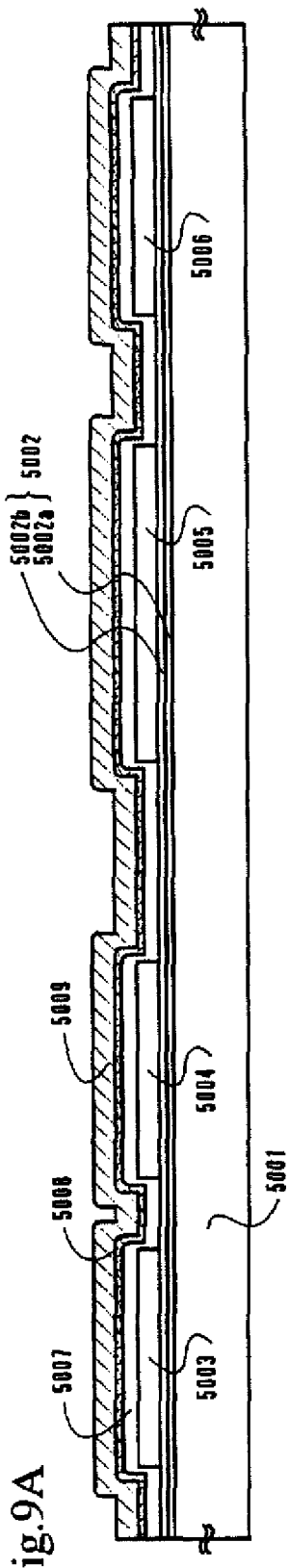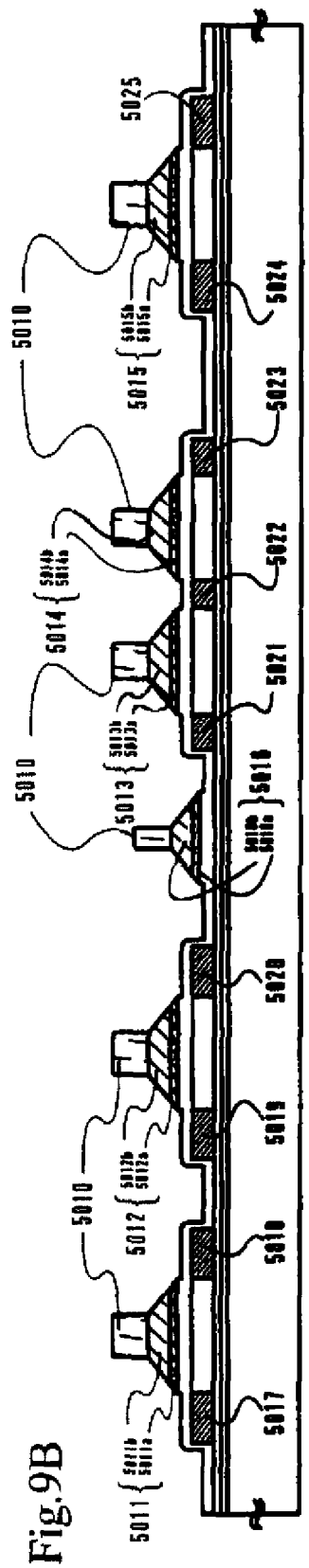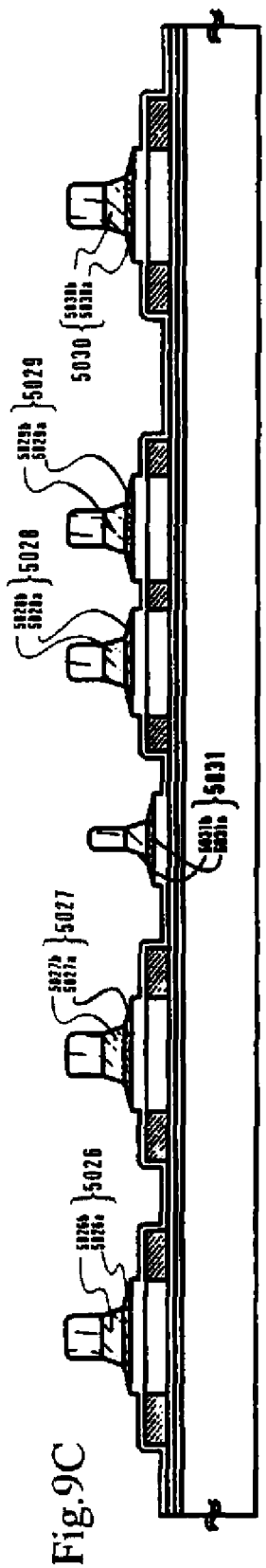

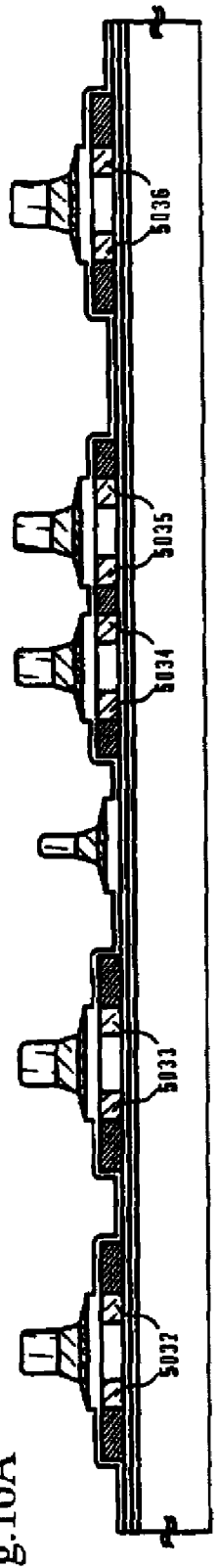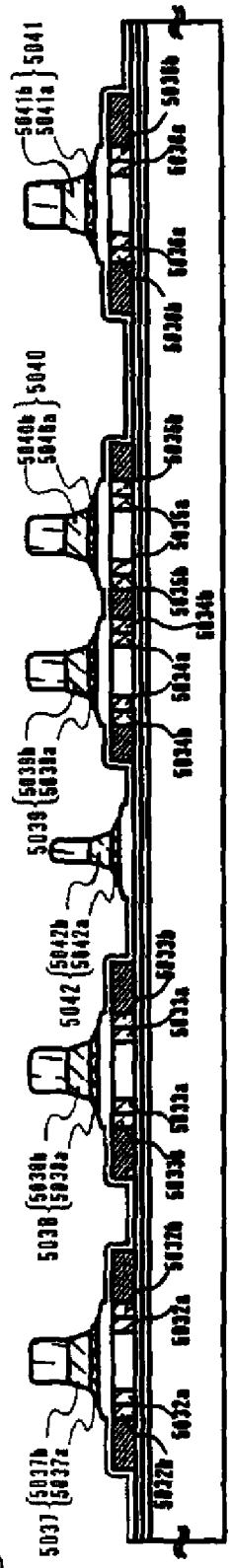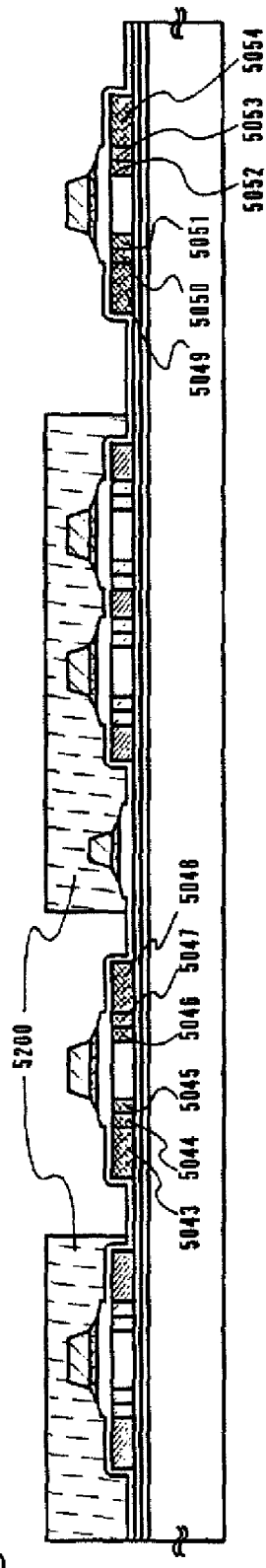

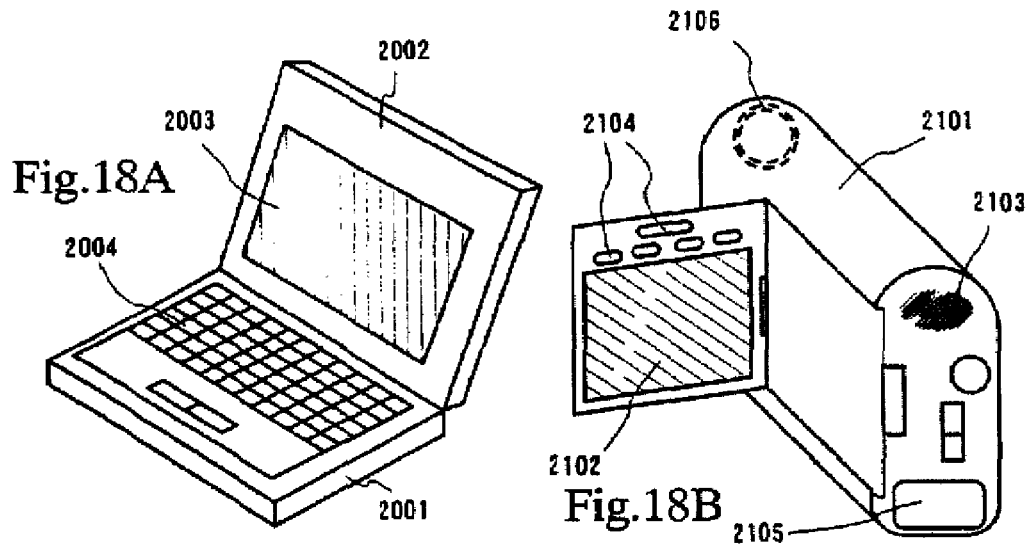
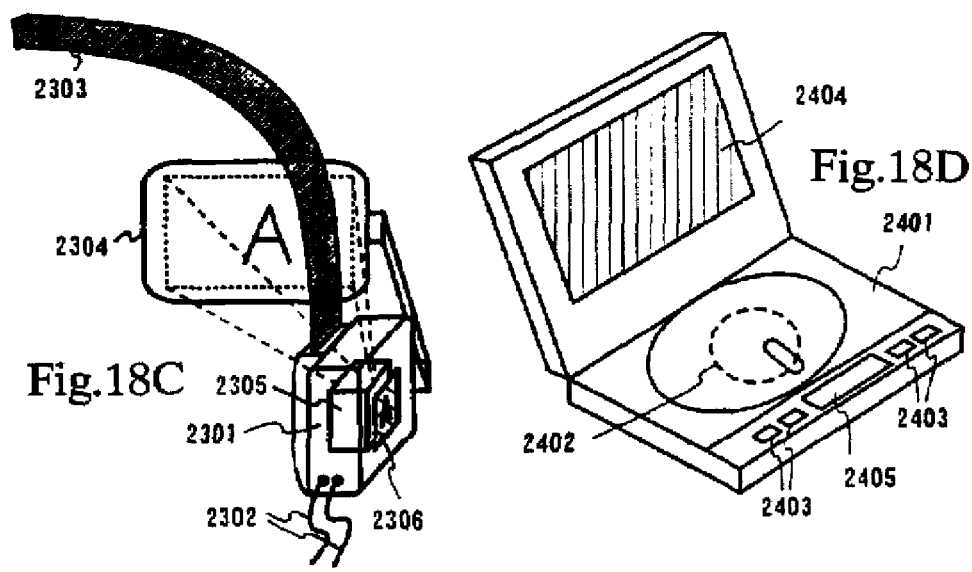
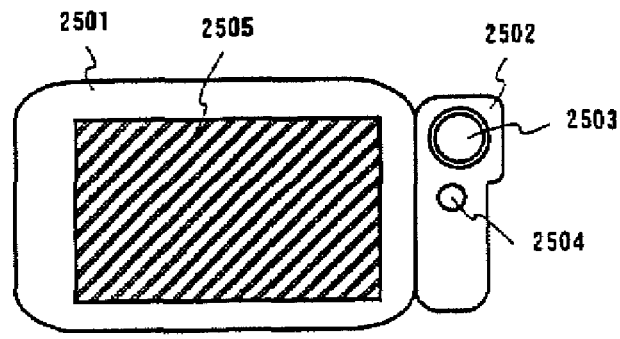
Fig.18A
Fig.18B
Fig.18C
Fig.18D
Fig.18E

DISPLAY DEVICE AND METHOD OF DRIVING THE SAME

CROSS-REFERENCE TO RELATED APPLICATIONS

This application is a continuation of U.S. application Ser. No. 10/924,775, filed Aug. 25, 2004, now allowed, which is a continuation of U.S. application Ser. No. 09/924,610, filed Aug. 9, 2001, now U.S. Pat. No. 6,828,950, which claims the benefit of a foreign priority application filed in Japan as Serial No. 2000-243272 on Aug. 10, 2000, all of which are incorporated by reference.

BACKGROUND OF THE INVENTION

1. Field of the Invention

The present invention relates to an electron display device in which electro luminescence (EL) elements are formed on a substrate, and a method of driving the same. In particular, the present invention relates to an EL display device using semiconductor devices (devices using a semiconductor thin film), and a method of driving the same. The present invention also relates to electronic devices using an EL display device in a display portion.

2. Description of the Related Art

In recent years, EL display devices including EL elements as self light-emitting elements are being actively developed. An EL display device is also called an organic EL display (OELD) or an organic light-emitting diode (OLED).

An EL display device is of a self light-emitting type, unlike a liquid crystal display device. An EL element has a structure in which an EL layer is interposed between a pair of electrodes (anode and cathode), and the EL layer usually has a layered structure. Typically, there is a layered structure "hole transport layer/light-emitting layer/electron transport layer" proposed by Tang of Eastman Kodak. This structure has a very high light-emitting efficiency, and most of the EL display devices that are being studied and developed adopt this structure.

Alternatively, an EL layer may have a structure in which a hole injection layer, a hole transport layer, a light-emitting layer, and an electron transport layer are stacked in this order on an anode or a structure in which a hole injection layer, a hole transport layer, a light-emitting layer, an electron transport layer, and electron injection layer are stacked in this order on an anode. A light-emitting layer may be doped with a fluorescent colorant.

In the present specification, all the layers provided between a cathode and an anode are collectively referred to as an "EL layer". Therefore, the above-mentioned hole injection layer, hole transport layer, light-emitting layer, electron transport layer, electron injection layer, etc. are all included in the EL layer.

A predetermined voltage is applied to an EL layer with the above-mentioned structure through a pair of electrodes, whereby carriers are recombined in a light-emitting layer to emit light. In the present specification, light emission of an EL element is referred to "driving of an EL element". Furthermore, in the present specification, a light-emitting element composed of an anode, an EL layer, and a cathode is referred to as an "EL element".

In the present specification, an anode and a cathode of an EL element may be referred to as "both electrodes" of an EL element.

In the present specification, an EL element refers to both an element utilizing light emission (fluorescence) from singlet excitons and an element utilizing light emission (phosphorescence) from triplet excitons.

As a method of driving an EL display device, there is an active matrix system.

FIG. 6 is a block diagram showing an exemplary active matrix type display device. In a pixel portion, source signal lines for receiving a signal from a source signal line driving circuit and gate signal lines for receiving a signal from a gate signal line driving circuit are formed in a matrix. Furthermore, power supply lines are formed in parallel with the source signal lines. In the present specification, the electric potential of the power supply line is referred to as a "power supply potential".

FIG. 5 shows a structure of a pixel portion of an active matrix type EL display device. Gate signal lines ($G_1$ to $G_y$) for receiving a selection signal from a gate signal line driving circuit are connected to gate electrodes of switching TFTs 301 of respective pixels. Furthermore, one of a source region and a drain region of the switching TFT 301 of each pixel is connected to a source signal line ($S_1$ to $S_x$) for receiving a signal from the source signal line driving circuit, and the other is connected to a gate electrode of an EL driving TFT 302 and one electrode of a capacitor 303 of each pixel. The other electrode of the capacitor 303 is connected to a power supply line ($V_1$ to $V_x$). One of a source region and a drain region of the EL driving TFT 302 of each pixel is connected to the power supply line ($V_1$ to $V_x$), and the other is connected to an EL element 304 of each pixel.

The EL element 304 includes an anode, a cathode, and an EL layer provided between the anode and the cathode. In the case where the anode of the EL element 304 is connected to the source region or the drain region of the EL driving TFT 302, the anode of the EL element 304 functions as a pixel electrode, and the cathode thereof functions as a counter electrode. On the other hand, in the case where the cathode of the EL element 304 is connected to the source region or the drain region of the EL driving TFT 302, the cathode of the EL element 304 functions as a pixel electrode and the anode thereof functions as a counter electrode.

In the present specification, the electric potential of a counter electrode is referred to as a "counter potential". A power source for supplying a counter potential to the counter electrode is referred to as a "counter power source". The potential difference between the electric potential of the pixel electrode and that of the counter electrode is an EL driving voltage, which is applied to the EL layer.

As a gray-scale display method of the above-mentioned EL display device, there are an analog gray-scale system and a time gray-scale system.

First, an analog gray-scale system of an EL display device will be described. FIG. 7 shows a timing chart in the case where the display device in FIG. 5 is driven by the analog gray-scale system. A period, which starts when one gate signal line is selected and finishes when the subsequent gate signal line is selected, is referred to as "one line period (L)". A period, which starts when one image is selected and finishes when the subsequent image is selected, corresponds to one frame period. In the case of the EL display device in FIG. 5, there are y gate signal lines, so that y line periods ($L_1$ to $L_y$) are provided in one frame period.

As a resolution is increased, the number of line periods in one frame period is also increased, which makes it necessary to drive a driving circuit at a high frequency.

The power supply lines ($V_1$ to $V_x$) are kept at a constant potential. The counter potential is also kept constant. The counter potential has a potential difference with respect to the power supply potential to such a degree that an EL element emits light.

In a first line period ($L_1$), a selection signal is supplied to a gate signal line $G_1$ from the gate signal line driving circuit. Then, an analog video signal is successively input to the source signal lines ($S_1$ to $S_x$). All the switching TFTs 301 connected to the gate signal line $G_1$ are turned on, so that the analog video signals input to the source signal lines $S_1$ to $S_x$ are input to the gate electrodes of the EL driving TFTs 302 through the switching TFTs 301.

The switching TFT 301 is turned on, and the analog video signal input to the pixels becomes a gate voltage of the EL driving TFT 302. At this time, a drain current is determined with respect to a gate voltage in one-to-one correspondence, in accordance with Id-Vg characteristics of the EL driving TFT 302. More specifically, the electric potential of the drain region (EL driving potential in an ON state) is determined so as to correspond to the voltage of the analog video signal input to the gate electrode of the EL driving TFT 302. Then, a predetermined drain current flows through the EL element, and the EL element emits light in a light emission amount corresponding to the current amount.

When the above-mentioned operation is repeated and an input of the analog video signals to the source signal lines ($S_1$ to $S_x$) is completed, the first line period ($L_1$) is completed. A combination of a period, which finishes when the input of the analog video signals to the source signal lines ($S_1$ to $S_x$) is completed, and a horizontal retrace period may be defined as one line period. In a second line period ($L_2$), a selection signal is supplied to a gate signal line $G_2$. Then, analog video signals are successively input to the source signal lines ($S_1$ to $S_x$) in the same way as in the first line period ($L_1$).

When selection signals are supplied to all the gate signal lines ($G_1$ to $G_y$), all the line periods ($L_1$ to $L_y$) are completed. When all the line periods ($L_1$ to $L_y$) are completed, one frame period is completed. In one frame period, all the pixels perform a display, whereby one image is formed. A combination of all the line periods ($L_1$ to $L_y$) and a vertical retrace period may be defined as one frame period.

As described above, the light emission amount of the EL element is controlled with an analog video signal, and a gray-scale display is performed by controlling the light emission amount. Thus, according to the analog gray-scale system, a gray-scale display is conducted based on variations in a potential of an analog video signal input to a source signal line.

Next, a time gray-scale system will be described.

According to the time gray-scale system, a digital signal is input to a pixel, and a light emission time of an EL element of the pixel is controlled with the digital signal, whereby gray-scale is exhibited.

Herein, the case will be described in which n (n is a natural number of 2 or more) bits of digital signal is input, and a display with $2^n$ gray-scale is conducted.

FIG. 8 shows a timing chart in the case where the display device in FIG. 5 is driven by the time gray-scale system. First, one frame period is divided into n (n is a natural number of 2 or more) sub-frame periods ($SF_1$ to $SF_n$). A period in which all the pixels in a pixel portion display one image is referred to as "one frame period (F)". A plurality of periods obtained by dividing one frame period correspond to sub-frame periods. As the level of gray-scale is increased, the division number of one frame period is also increased, which makes it necessary to drive a driving circuit at a high frequency.

One sub-frame period is classified into a write period (Ta) and a display period (Ts). The write period refers to a period in which digital signals are input to all the pixels in one sub-frame period. The display period (lighting period) refers to a period in which a light-emitting state or non light-emitting state of an EL element is selected to conduct a display.

The EL driving voltage shown in FIG. 8 represents an EL driving voltage of an EL element with a light-emitting state selected. More specifically, the EL driving voltage of the EL element with a light-emitting state selected becomes 0 volt during a write period. During a display period, the EL driving voltage of the EL element with a light-emitting state selected has a level to such a degree that the EL element emits light.

The counter potential is controlled with an external switch (not shown). The counter potential is kept at the same level as that of the power supply potential during a write period, and has a potential difference with respect to the power source potential to such a degree that an EL element emits light during a display period.

First, a write period and a display period of each sub-frame period will be described in detail by using in FIGS. 5 and 8, and thereafter, the time gray-scale display will be described in detail.

First, a signal is input to a gate signal line $G_1$, and all the switching TFTs 301 connected to the gate signal line $G_1$ are turned on. Then, a digital signal is successively input to the source signal lines ($S_1$ to $S_x$). The counter potential is kept at the same level as that of the power supply potential of the power supply lines ($V_1$ to $V_x$). A digital signal has information of "0" or "1". Digital signals "0" and "1" mean those which have either a Hi voltage or a Lo voltage.

The digital signal input to the source signal line ($S_1$ to $S_x$) is input to the gate electrode of the EL driving TFT 302 via the switching TFT 301 in an ON state. The digital signal is also input to the capacitor 303 and retained therein.

A signal is input successively to the gate signal lines $G_2$ to $G_y$, whereby the above-mentioned operation is repeated. All the pixels are supplied with the digital signal, and the digital signal thus input is retained in each pixel. A period up to when all the pixels are supplied with digital signal, is referred to as a "write period".

When all the pixels are supplied with the digital signal, all the switching TFTs 301 are turned off. Then, the counter potential is changed by an external switch (not shown) connected to the counter electrode, so as to have a potential difference with respect to the power source potential to such a degree that the EL element 304 emits light.

In the case where the digital signal has information of "0", the EL driving TFT 302 is turned in an OFF state, and the EL element 304 does not emit light. In contrast, in the case where the digital signal has information of "1", the EL driving TFT 302 is turned in an ON state. Consequently, the pixel electrode of the EL element 304 is kept substantially at the power supply potential, and the EL element 304 emits light. Thus, due to the digital signal, a light-emitting state or a non light-emitting state of the EL element is selected, whereby all the pixels conduct a display at the same time. When all the pixels conduct a display, an image is formed. A period during which pixels conduct a display refers to as a "display period".

Herein, it is assumed that the lengths of write periods ($Ta_1$ to $Ta_n$) of respective n sub-frame periods ($SF_1$ to $SF_n$) are the same, and the display period (Ts) of the respective sub-frame periods ($SF_1$ to $SF_n$) corresponds to $Ts_1$ to $Ts_n$.

For example, the lengths of the display periods $Ts_1$ to $Ts_n$ are set so as to be $Ts_1: Ts_2: Ts_3: \ldots : Ts_{(n-1)}: Ts_n = 2^0 : 2^{-1} : 2^{-2} : \ldots : 2^{-(n-1)} : 2^{-(n-1)}$. By combining these display periods, a desired gray-scale display among $2^n$-level gray-scale can be conducted.

A display period is either one of the periods $Ts_1$ to $Ts_n$. Herein, it is assumed that predetermined pixels are lightened during the period $Ts_1$.

Then, a subsequent write period comes again and all the pixels are supplied with digital signals. Thereafter, a display period comes. At this time, either one of the periods $Ts_2$ to $Ts_n$ becomes a display period. Herein, it is assumed that predetermined pixels are lightened during the period $Ts_2$.

Hereinafter, it is assumed that the same operation is repeated with respect to the remaining (n−2) sub-frames, display periods are successively set to be $Ts_3, Ts_4, \ldots, Ts_n$, and predetermined pixels are lightened in each sub-frame.

When n sub-frame periods appear, one frame period is completed. At this time, by adding up the lengths of display periods during which pixels have been lightened, the gray-scale of the pixels is determined. For example, assuming that the brightness in the case where pixels emit light during all the display periods is 100% at n=8, 75% brightness can be exhibited when pixels emit light during the periods $Ts_1$ and $Ts_2$, and 16% brightness can be exhibited when pixels emit light during the periods $Ts_3$, $Ts_5$, and $Ts_8$.

In the present specification, a display period, in which an EL element of a pixel is put in a light-emitting state or a non light-emitting state by a signal of higher order bits among the digital signals input to the display device, is referred to as "a display period of higher order bits". Furthermore, a display period, in which an EL element of a pixel is put in a light-emitting state or a non light-emitting state by a signal of lower order bits among the digital signals input to the display device, is referred to as "a display period of lower order bits".

In the case of using a conventional analog gray-scale system, the following problems arise.

The analog gray scale method has the problem that the unevenness of the characteristics of TFTs greatly affects gray scale display. For example, it is assumed that the Id-Vg characteristics of switching TFTs differ between two pixels which represent the same gray scale (the characteristic of either one of the pixels is shifted as a whole to a plus or minus side relative to the characteristic of the other).

In the above-mentioned case, even when the same voltage is applied to the gate electrodes of the respective switching TFTs, drain currents of the respective switching TFTs take different values, and gate voltages with different values are applied to the EL driving TFTs of the respective pixels. In other words, different amounts of currents flow into the EL elements of the respective pixels, and as a result, the amounts of emissions from the EL elements differ from each other and the same gray scale cannot be represented.

Even if equal gate voltages are applied to the EL driving TFTs of the respective pixels, the EL driving TFTs cannot output the same amount of drain current so long as the Id-Vg characteristics of the EL driving TFTs are not even. For this reason, if the Id-Vg characteristics of the switching TFTs slightly differ from each other, the amounts of currents outputted from the EL driving TFTs greatly differ from each other even when equal gate voltages are applied to the EL driving TFTs. As a result, owing to a slight unevenness of the Id-Vg characteristics, the amounts of emissions from the EL elements greatly differ between adjacent pixels even if signals of the same voltage are applied to the EL driving TFTs.

Gray scale display actually becomes far more non-uniform owing to a synergistic effect of the unevenness of the characteristics of the switching TFTs and the unevenness of the characteristics of the EL driving TFTs. Thus, analog gray scale display is extremely sensitive to the unevenness of the characteristics of TFTs. Accordingly, when this EL display device provides gray scale display, there is the problem that the display becomes considerably uneven.

On the other hand, in the case of using a conventional time gray-scale system, the following problems arise.

When the level of gray-scale is increased, the division number of one frame is also increased. Then, in particular, a display period of lower order bits becomes shorter.

In the above-mentioned case, there is a problem that the waveform of a voltage applied to an EL element is corrupted.

In applying a voltage to an EL element during a display period after a write period, voltages of counter electrodes of EL elements of all the pixels are changed at the same time. Therefore, the influence of loads on the EL elements and wirings is very large, so that the waveforms of voltages applied to the EL elements of all of the pixels are corrupted.

In the case where the waveform of a voltage applied to an EL element is corrupted, a predetermined voltage cannot be sufficiently applied to an EL element particularly during a display period of lower order bits that is shortened, which makes it difficult to conduct an exact gray-scale display.

Furthermore, a voltage applied to an EL element in a pixel portion from a power supply line is varied due to the wiring resistance of the power supply line and the like. Therefore, the fluctuation in an applied voltage changes a current to flow through the EL element in the pixel portion, which may cause variations in brightness.

Furthermore, the amount of a current to flow through an EL element is also influenced by a temperature.

Herein, the brightness of an EL element is proportional to a current flowing through the EL element. Therefore, when the current flowing through the EL element is changed, the brightness of the EL element is also changed.

FIG. 4 is a graph showing the changes in the I-V characteristics of an EL element caused by (temperature characteristic). From this graph, it is possible to know the amounts of currents which flow through the EL element with respect to voltages applied across both electrodes of the EL element at certain temperatures. A temperature $T_1$ is higher than a temperature $T_2$, and the temperature $T_2$ is higher than a temperature $T_{3m}$. As can be seen from FIG. 4, even if the voltage applied across the both electrodes of the EL element in the pixel portion is the same, the current flowing between both electrodes of the EL element becomes larger owing to the temperature characteristic of the EL element as the temperature of the EL element becomes higher. Accordingly, a current to flow through an EL element in a pixel portion is varied due to the environment temperature for an EL display device, and the brightness of the EL element in the pixel portion is changed.

Because of the above, exact gray-scale cannot be exhibited, which is one of the reasons for degrading the reliability of an EL display device.

SUMMARY OF THE INVENTION

Therefore, with the foregoing in mind, it is an object of the present invention to provide a display device in which the fluctuations in brightness caused by an environment temperature of an EL element are suppressed by a gray-scale display method that is unlikely to be influenced by variations in characteristics of TFTs in a pixel portion and that is not required to change an EL driving voltage at a high speed.

A display is conducted by using a time gray-scale system in which one frame period is divided into a plurality of sub-frame periods, and a voltage applied between both electrodes of an EL element (first EL element) of a pixel with a light-emitting state selected is varied every sub-frame.

A voltage applied between both electrodes of an EL element (first EL element) of a pixel with a light-emitting state selected during a display period of lower order bits is set to be smaller than a voltage applied between both electrodes of an EL element (first EL element) of a pixel with a light-emitting state selected during a display period of higher order bits. Thus, the display period of lower order bits can be made longer, compared with the conventional time gray-scale system.

The voltage applied between both electrodes of an EL element (first EL element) with a light-emitting state selected is generated by selecting one of a plurality of constant current sources to be the standard of gray-scale and allowing a predetermined current to flow between both electrodes of a monitor EL element (second EL element) formed on the same substrate on which a pixel portion including the first EL element is formed.

Furthermore, by using a buffer amplifier, a voltage applied between electrodes of an EL element (first EL element) of a pixel is kept constant.

With the above, it becomes possible to provide a display device in which the fluctuations in brightness caused by an environment temperature of an EL element are suppressed by a gray-scale display method that is unlikely to be influenced by variations in characteristics of TFTs in a pixel portion and that is not required to change an EL driving voltage at a high speed.

The constitution of the present invention will be described below.

According to the present invention, there is provided a method of driving a display device including a first EL element and a second EL element, each comprising a first electrode, a second electrode and an EL layer provided between the first electrode and the second electrode, wherein one frame period is divided into a plurality of sub-frame periods, the first EL element is in a light-emitting state or in a non light-emitting state on a basis of each of the plurality of sub-frame periods, a constant current is allowed to flow between the first electrode and the second electrode of the second EL element in each of the plurality of sub-frame periods, a voltage between the first electrode and the second electrode of the first EL element that is in the light-emitting state is equal to a voltage between the first electrode and the second electrode of the second EL element through which the constant current flows, and respective values of the constant current are during two sub-frame periods among the plurality of sub-frame periods.

According to the present invention, there is provided a method of driving a display device including a first EL element and a second EL element, each comprising a first electrode, a second electrode and an EL layer provided between the first electrode and the second electrode, wherein one frame period is divided into a plurality of sub-frame periods, the first EL element is in a light-emitting state or in a non light-emitting state on a basis of each of the plurality of sub-frame periods, a constant current is allowed to flow between the first electrode and the second electrode of the second EL element in each of the plurality of sub-frame periods, a voltage between the first electrode and the second electrode of the first EL element that is in the light-emitting state is equal to a voltage between the first electrode and the second electrode of the second EL element through which the constant current flows, and a value of the constant current is different during each of the plurality of sub-frame periods.

According to the above-mentioned method of driving a display device, a length of each of the plurality of sub-frame periods may be the same.

According to the present invention, there is provided a method of driving a display device including a first EL element and a second EL element, each comprising a first electrode, a second electrode and an EL layer provided between the first electrode and the second electrode, wherein one frame period is divided into n (n is a natural number of 2 or more) sub-frame periods, the first EL element is in a light-emitting state or in a non light-emitting state on a basis of each of the n sub-frame periods, a constant current is allowed to flow between the first electrode and the second electrode of the second EL element during each of the n sub-frame periods, a voltage between the first electrode and the second electrode of the first EL element that is in the light-emitting state is equal to a voltage between the first electrode and the second electrode of the second EL element through which the constant current flows, and a ratio of a value of the constant current during each of the n sub-frame periods is $2^0:2^{-1}:2^{-2}:\ldots:2^{-(n-2)}:2^{-(n-1)}$.

An electronic device using the above-mentioned method of driving a display device may be a video camera, an image reproducing apparatus, a head mount display, a personal computer, or information terminal equipment.

According to the present invention, there is provided a display device including a plurality of pixels each comprising a TFT and a first EL element, a power supply line, a buffer amplifier, a second EL element, and constant current sources A1 and A2 for outputting constant currents with different values, wherein each of the first EL element and the second EL element respectively has a first electrode, a second electrode, and an EL layer provided between the first electrode and the second electrode, a switch functions for selecting whether an output terminal of the constant current source A1 is connected to the first electrode of the second EL element or an output terminal of the constant current source A2 is connected to the first electrode of the second EL element, the first electrode of the second EL element is connected to a non-inversion input terminal of the buffer amplifier, the output terminal of the buffer amplifier is connected to the power supply line, and an electric potential of the power supply line is applied to the first electrode of the EL element via the TFT.

According to the present invention, there is provided a display device including a plurality of pixels each comprising a TFT and a first EL element, a power supply line, a buffer amplifier, a second EL element, and n (n is a natural number of 2 or more) constant current sources for outputting constant currents with the same value, wherein each of the first EL element and the second EL element respectively has a first electrode, a second electrode, and an EL layer provided between the first electrode and the second electrode, a switch functions for selecting whether m (m is a natural number of n or less) output terminals of the n constant current sources are connected to the first electrode of the second EL element or k (k is a natural number of n or less, different from m) output terminals of the n constant current sources are connected to the first electrode of the second EL element, the first electrode of the second EL element is connected to a non-inversion input terminal of the buffer amplifier, the output terminal of the buffer amplifier is connected to the power supply line, and an electric potential of the power supply line is applied to the first electrode of the first EL element via the TFT.

In the above-mentioned display device, the first electrodes of the first EL element and the second EL element may be anodes, and the second electrodes thereof may be cathodes.

In the above-mentioned display device, the first electrodes of the first EL element and the second EL element may be cathodes, and the second electrodes thereof may be anodes.

An electronic device using the above-mentioned display device may be a video camera, an image reproducing apparatus, a head mount display, a personal computer, or information terminal equipment.

These and other advantages of the present invention will become apparent to those skilled in the art upon reading and understanding the following detailed description with reference to the accompanying figures.

BRIEF DESCRIPTION OF THE DRAWINGS

In the accompanying drawings:

FIGS. 9A to 9C show the steps of producing the EL display device of the present invention;

FIGS. 10A to 10C show the steps of producing the EL display device of the present invention;

FIGS. 18A to 18E show exemplary electronic devices using the EL display device of the present invention.

DESCRIPTION OF THE PREFERRED EMBODIMENTS

Figure 1:
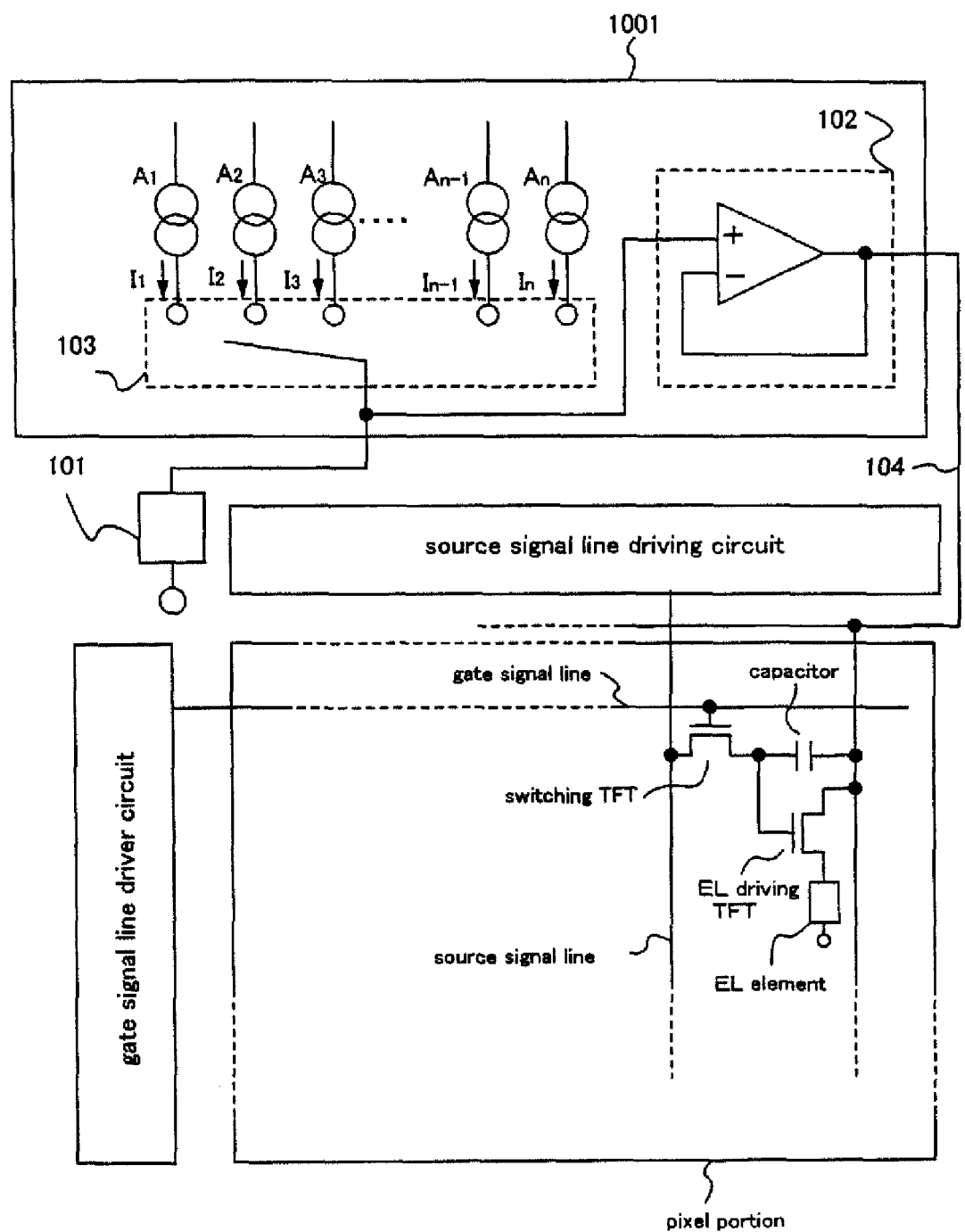
FIG. 1 is a view showing a configuration of an EL display device of the present invention.

The constitution of the present invention will be described with reference to FIG. 1.

Herein, a display device with $2^n$ (n is a natural number of 2 or more) gray-scale will be described. The present invention is not limited to $2^n$ gray scale, and is applicable to a display device using another gray-scale.

Reference numeral 101 denotes a monitor EL element (second EL element), 102 denotes a buffer amplifier, and $A_1$ to $A_n$ denote constant current sources for allowing constant currents $I_1$ to $I_n$ to flow, respectively.

In the present specification, the constant current source is assumed to be an element for outputting a constant current from its output terminal at all times.

As the constant current source of the display device according to the present invention, those which have a known structure can be arbitrarily used.

An EL element (first EL element) of each pixel in a pixel portion and the monitor EL element (second EL element) 101 are respectively produced so as to have a first electrode, a second electrode, and an EL layer provided between the first electrode and the second electrode, and have substantially the same I-V characteristics of the EL layer at the same temperature.

Reference numeral 103 denotes a switch which selects either of the constant current sources $A_1$ to $A_n$, thereby connecting the output terminal thereof to one electrode (first electrode) of the monitor EL element (second EL element) 101.

The monitor EL element (second EL element) 101 is formed on the same substrate on which a pixel portion is formed. In the present specification, the substrate on which the pixel portion is formed is referred to as a "pixel substrate".

The monitor EL element (second EL element) and the EL element (first EL element) in the pixel portion can be produced simultaneously.

The constant current sources $A_1$ to $A_n$ and the buffer amplifier 102 are collectively denoted by 1001. The portion 1001 may be formed on the pixel substrate, formed on a single crystal IC chip so as to be attached to the pixel substrate, or produced on an external substrate.

It is assumed that one electrode (first electrode) of the monitor EL element (second EL element) 101 is connected to an output terminal of the constant current source $A_1$ via the switch 103. At this time, a constant current $I_1$ is input between both electrodes (i.e., first electrode and second electrode) of the monitor EL element (second EL element) 101.

Figure 4:
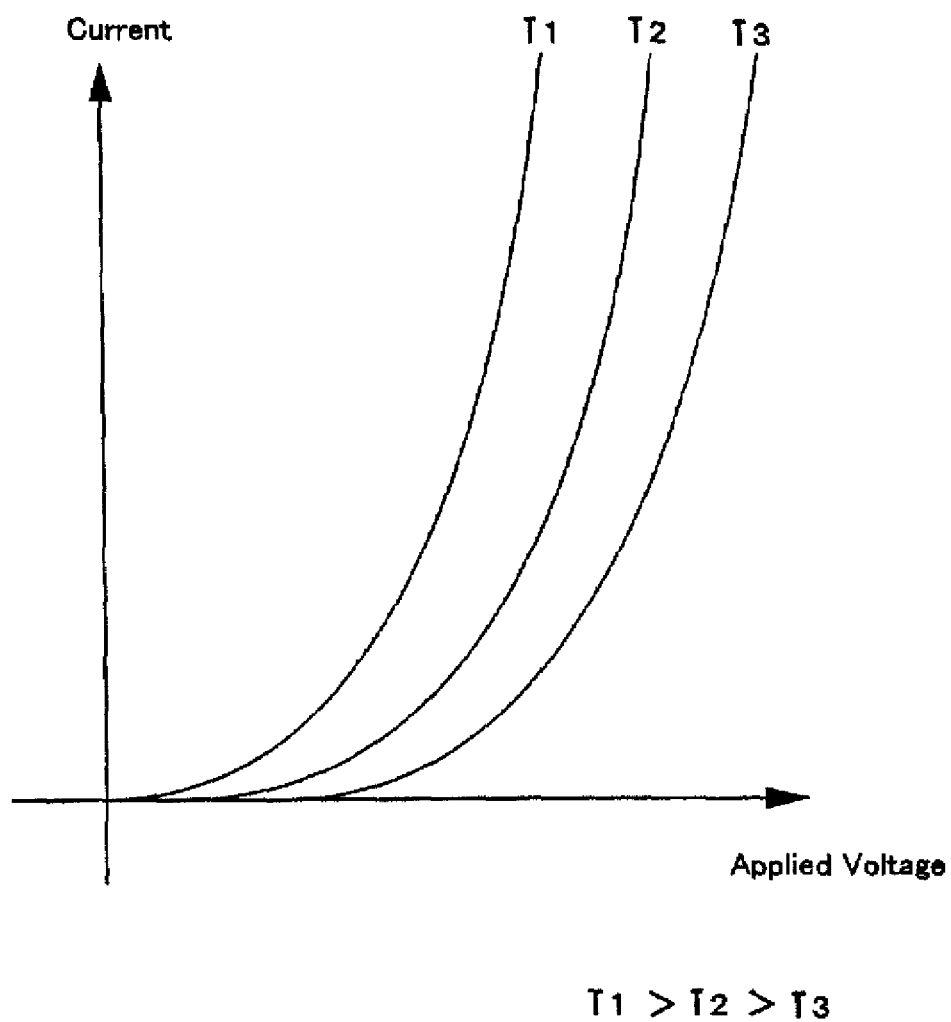
FIG. 4 is a graph showing temperature characteristics of an EL element.
Figure 5:
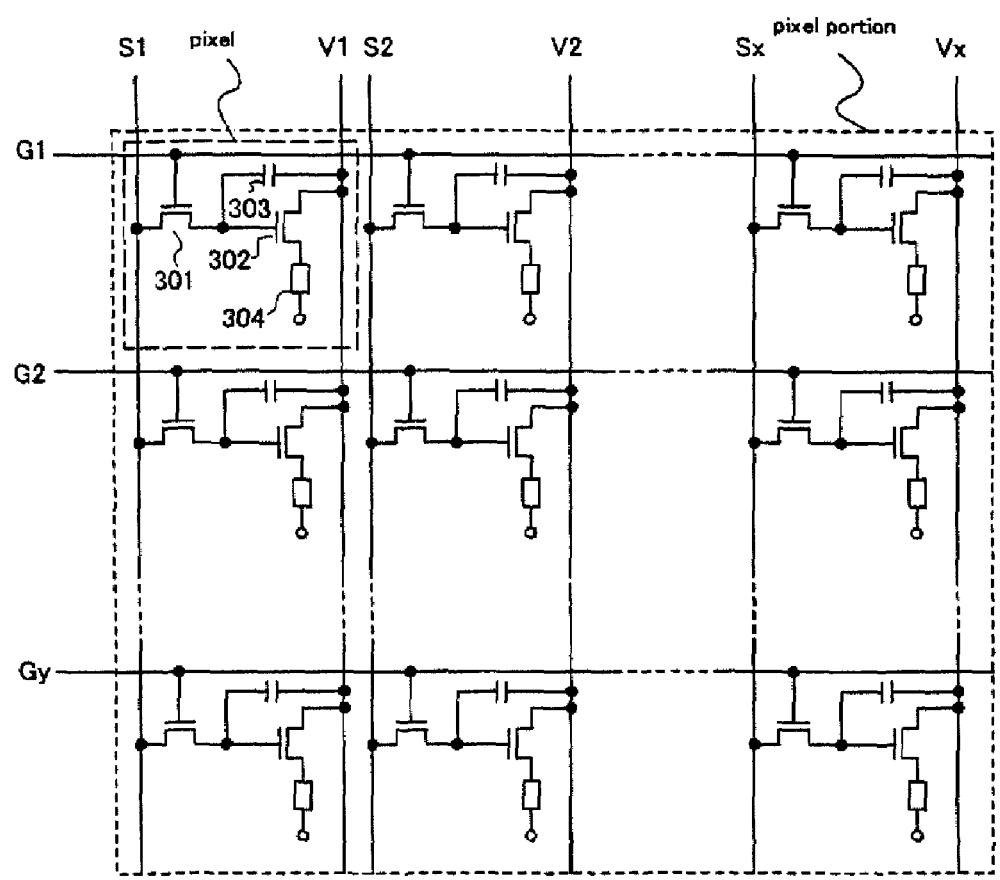
FIG. 5 is a view showing a configuration of a pixel portion of the EL display device of the present invention.
Figure 6:
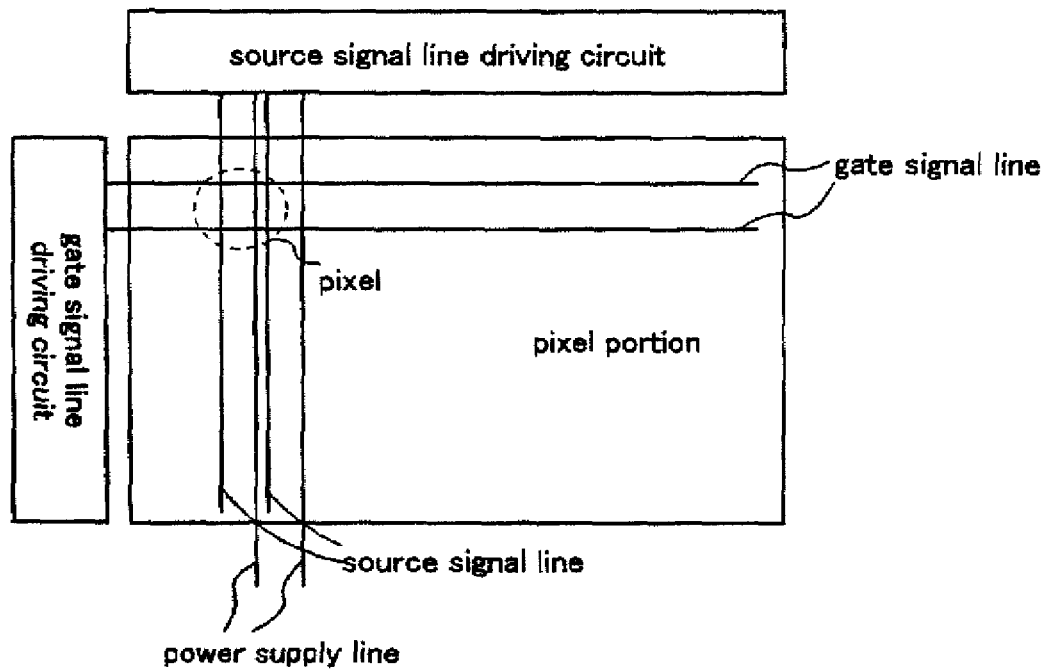
FIG. 6 is a block diagram showing a configuration of the EL display device of the present invention.
Figure 7:
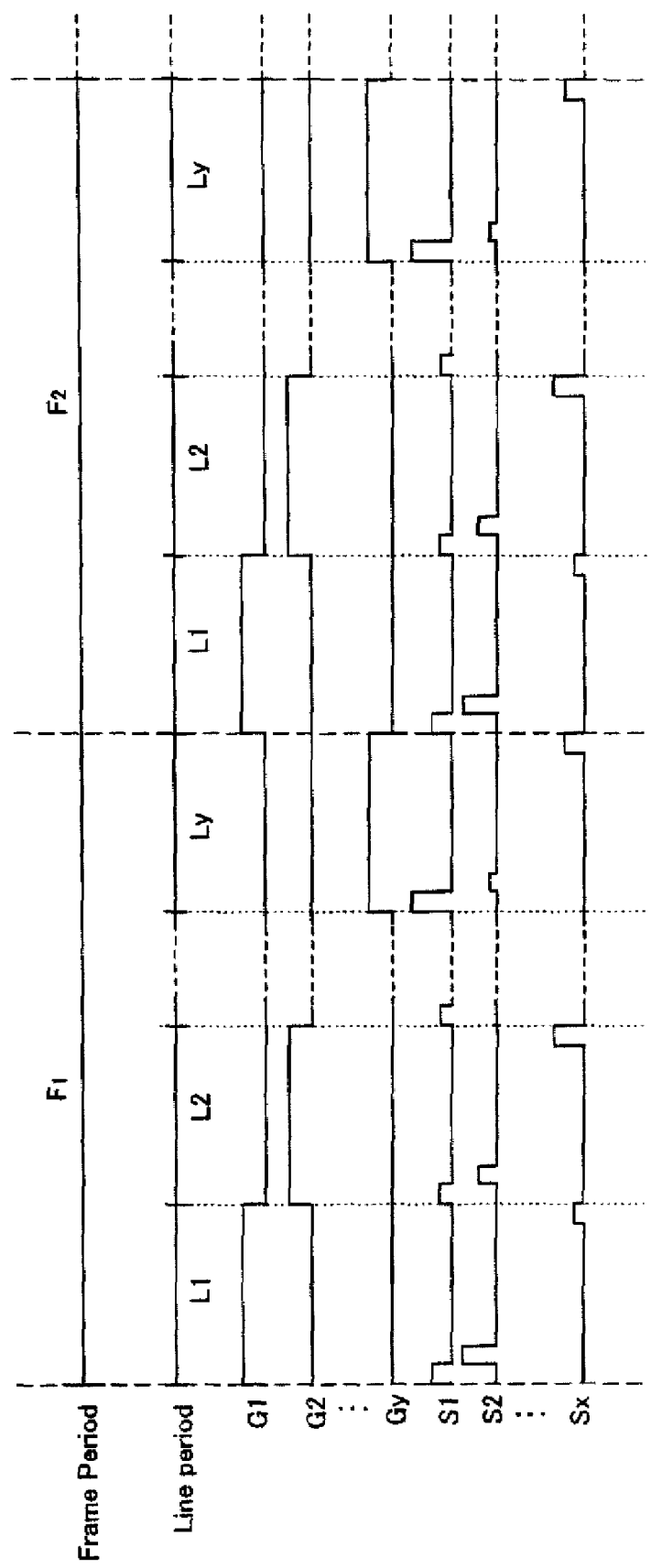
FIG. 7 is a timing chart of a conventional analog gray-scale system.
Figure 8:
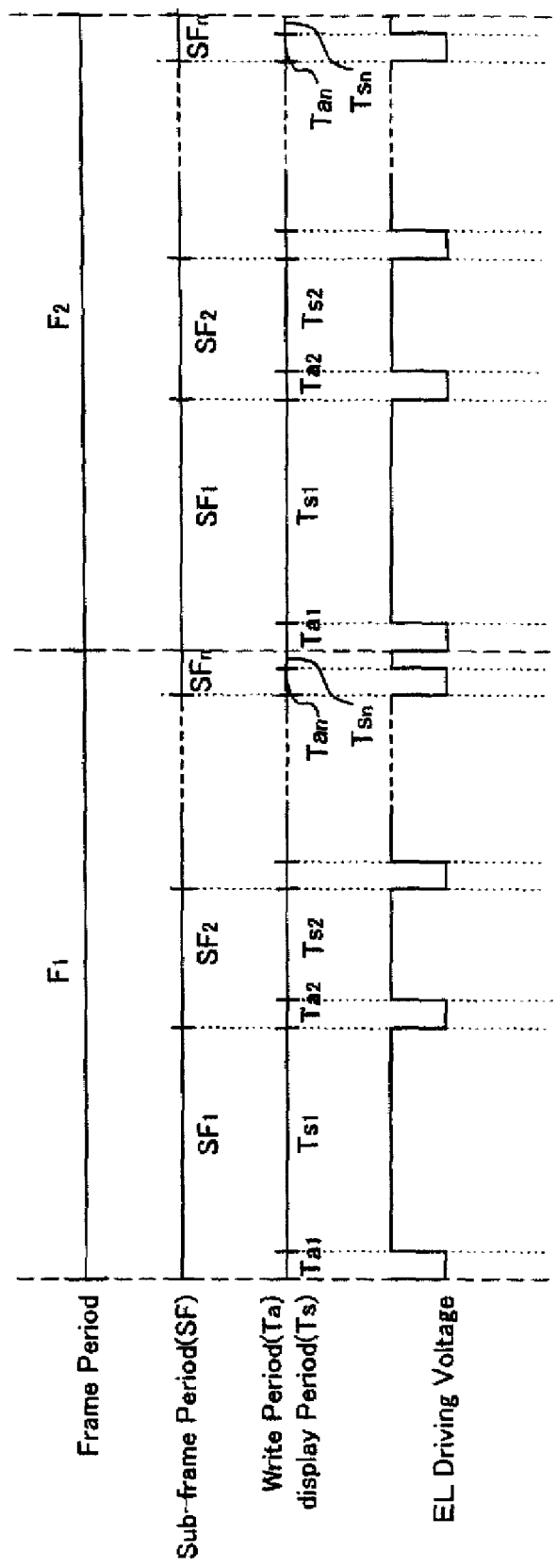
FIG. 8 is a timing chart of a conventional time gray-scale system.

When an environment temperature is changed, the current $I_1$ flowing between both electrodes (first electrode and second electrode) of the monitor EL element (second EL element) 101 connected to the constant current source $A_1$ is not changed; however, a voltage between both electrodes (first electrode and second electrode) of the monitor EL element (second EL element) 101 is changed due to temperature characteristics of the EL element shown in FIG. 4.

The electrode (second electrode) of the monitor EL element (second EL element) 101, that is not connected to the constant current source $A_1$, is supplied with a constant electric potential. This constant electric potential is set to be substantially the same as the electric potential of a counter electrode (second electrode) of the EL element (first EL element) in the pixel portion during a display period.

The buffer amplifier 102 has a non-inversion input terminal (+), an inversion input terminal (−), and an output terminal. The buffer amplifier 102 has a function of preventing the electric potential input to the non-inversion input terminal (+) from being changed by a load and wiring resistance connected to the output terminal.

As the buffer amplifier of the display device according to the present invention, those which have a known structure can be arbitrarily used.

The non-inversion input terminal (+) of the buffer amplifier 102 is connected to the electrode (first electrode) of the monitor EL element (second EL element), which is connected to the output terminal of the constant current source $A_1$, and is supplied with an electric potential of the electrode (first electrode) of the monitor EL element (second EL element). The electric potential of the electrode (first electrode) of the monitor EL element (second EL element) is input to a power supply line 104 via the buffer amplifier 102. When an EL driving TFT of a pixel connected to the power supply line 104 is turned on, the electric potential of the electrode (first electrode) of the monitor EL element (second EL element) is input to the first electrode of the EL element (first EL element) in the pixel portion.

The electric potential of the electrode (first electrode) of the monitor EL element (second EL element), which is connected to the output terminal of the constant current source, is changed in accordance with a temperature so as to allow a set constant current of the connected constant current source to flow. This electric potential becomes an electric potential of the pixel electrode (first electrode) of the EL element (first EL element) of the pixel. Thus, during a display period, the same voltage as that applied between both electrodes (first electrode and second electrode) of the monitor EL element (second EL element) is applied between both electrodes (first electrode and second electrode) of the EL element (first EL element) of the pixel with a light-emitting state selected. Accordingly, a constant current flows between both electrodes (first electrode and second electrode) of the EL element (first EL element) of the pixel.

As described above, a voltage, that is changed so as to allow a constant current to flow, is applied between the first electrode and the second electrode of the EL element (first EL element) in the pixel portion even when a temperature is changed. Thus, a current flowing through the EL element (first EL element) in the pixel portion can be kept constant to be irrespective of the change in temperature.

Since the EL element in the pixel portion and the monitor EL element are formed on the same substrate, substantially the same I-V characteristics are obtained at the same temperature. Therefore, the EL element (first EL element) in the pixel portion can be lightened with required lightness by adjusting a current flowing between the first electrode and the second electrode of the monitor EL element (second EL element).

Furthermore, the remaining constant current sources $A_2$ to $A_n$ are successively selected by switching the switch 103, and constant currents $I_2$ to $I_n$ are supplied to the monitor EL element (second EL element). Voltages generated between the first electrode and the second electrode of the monitor EL element (second EL element) by the constant currents $I_2$ to $I_n$ are applied between the first electrode and the second electrode of the EL element (first EL element) in the pixel portion by using the buffer amplifier 102.

Figure 2:
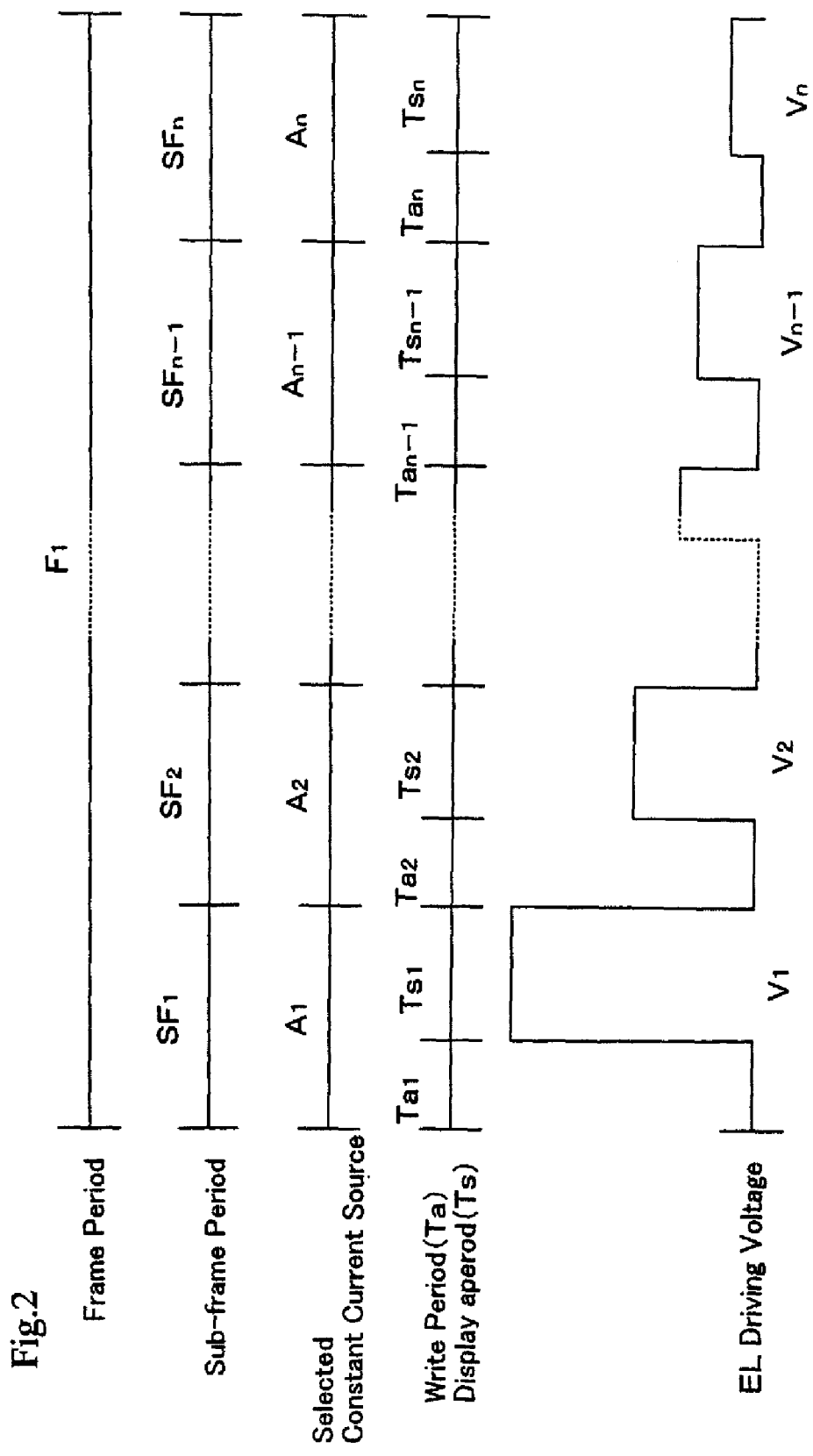
FIG. 2 is a timing chart of a gray-scale system of the EL display device of the present invention.

Hereinafter, a driving method of the present invention will be described with reference to a timing chart in FIG. 2. In FIG. 2, the same reference numerals as those in FIG. 1 are partially used.

One frame period is divided into a plurality of sub-frame periods $SF_1$ to $SF_n$. For each sub-frame period $SF_1$ to $SF_n$, one of the constant current sources $A_1$ to $A_n$ shown in FIG. 1 is successively selected by the switch 103, and the output terminal of the selected constant current source and the first electrode of the monitor EL element (second EL element) are connected to each other. At this time, voltages $V_1$ to $V_n$ corresponding to the constant currents $I_1$ to $I_n$ are applied to the power supply line.

The sub-frame periods include write periods $Ta_1$ to $Ta_n$ for supplying signals to all the pixels and selecting whether or not each pixel emits light, and display periods $Ts_1$ to $Ts_n$ in which EL elements (first EL elements) of all the pixels emit light or not in accordance with the signals supplied during the write periods $Ta_1$ to $Ta_n$.

It is assumed that the lengths of the write periods $Ta_1$ to $Ta_n$ are the same, and the lengths of the display periods $Ts_1$ to $Ts_n$ are also the same.

For each sub-frame period, the constant current sources $A_1$ to $A_n$ are successively selected, and the electric potential of the first electrode of the monitor EL element (second EL element) is changed in accordance with the constant currents $I_1$ to $I_n$ output from the respective constant current sources $A_1$ to $A_n$, and the electric potential of the power supply line is changed to $V_1$ to $V_n$ in accordance with the electric potential.

During the respective write periods $Ta_1$ to $Ta_n$, the electric potential of a counter electrode (second electrode) of the EL element (first EL element) in the pixel portion is kept at the same as the respective electric potentials $V_1$ to $V_n$ of the power supply line. Therefore, during the write periods $Ta_1$ to $Ta_n$, the EL driving voltage is 0 volt. On the other hand, during the display periods $Ts_1$ to $Ts_n$, the electric potential of the counter electrode (second electrode) of the EL element (first EL element) in the pixel portion is set so as to cause a potential difference with respect to the electric potential of the power supply line to such a degree that the EL element emits light.

The electric potential of the counter electrode (second electrode) of the EL element (first EL element) in the pixel portion during the write period is changed, corresponding to the electric potential of the power supply line varied every sub-frame period. The electric potential of the counter electrode during the display period may be the same during all the sub-frame periods.

Herein, it is assumed that the electric potential of the counter electrode of the EL element (first EL element) in the pixel portion during the display periods $Ts_1$ to $Ts_n$ is 0 volt. Then, the EL driving voltage applied between both electrodes (first electrode and second electrode) of the EL element (first EL element) of the pixel with a light-emitting state selected during the display periods $Ts_1$ to $Ts_n$ is changed to $V_1$ to $V_n$ every sub-frame period.

Due to the EL driving voltages $V_1$ to $V_n$, constant currents $I_{EL1}$ to $I_{ELn}$ that are proportional to the constant currents $I_1$ to $I_n$ output from the constant current sources $A_1$ to $A_n$ flow through the EL element (first EL element) in the pixel portion. The EL element has the property that its light-emitting brightness is substantially proportional to the currents $I_{EL1}$ to $I_{ELn}$ flowing through the element. Therefore, if the ratio of the currents $I_1$ to $I_n$ (i.e., the currents $I_1$ to $I_n$ flowing through the constant current sources $A_1$ to $A_n$), $I_1:I_2:\ldots:I_{n-1}:I_n$, is set to be $2^0:2^{-1}:\ldots:2^{-(n-2)}:2^{-(n-1)}$, the ratio of light-emitting brightness $Lm_1$ to $Lm_n$ in the case where the EL element (first EL element) in the pixel portion is allowed to emit light during each of the display periods, $Ts_1$ to $Ts_n$, $Lm_1:Lm_2:\ldots:Lm_{(n-1)}:Lm_n$, also becomes $2^0:2^{-1}:\ldots:2^{-(n-2)}:2^{-(n-1)}$.

At this time, by adding up the light emission amount during the display periods in which the pixel is lightened during one frame period, the brightness of the pixel is determined. For example, at n=8, it is assumed that the brightness in the case where the pixel is lightened during all the display periods $Ts_1$ to $Ts_n$ is 100%. When the pixel emits light during $Ts_1$ and $Ts_2$, about 75% brightness can be exhibited. On the other hand, when the display periods $Ts_3$, $Ts_5$ and $Ts_8$ are selected, about 16% brightness can be exhibited.

The display periods $Ts_1$ to $Ts_n$ may appear in any order. For example, it is also possible to allow the display periods to appear in the order of $Ts_1$, $Ts_4$, $Ts_3$, $Ts_2$, . . . , in one frame period.

Furthermore, in the case where a plurality of constant current sources for respectively outputting currents with different values are present as described above, it is also possible to exhibit gray-scale by selecting the same constant current source during a plurality of sub-frame periods in one frame period, and varying the length of the display periods of the respective sub-frame periods for which the same constant current source is selected.

Figure 19:
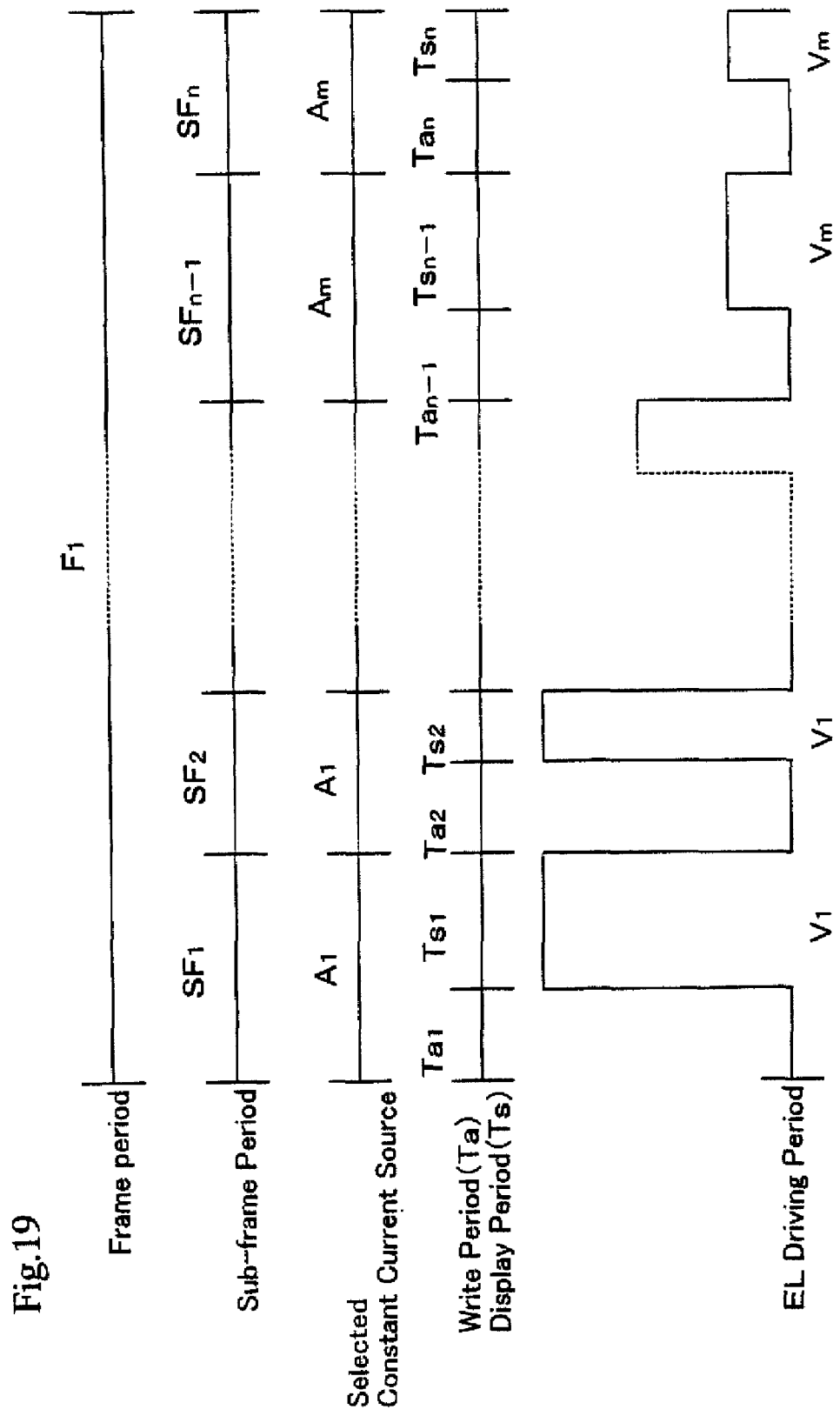
FIG. 19 is a timing chart of a gray-scale system of the EL display device of the present invention.

For example, as shown in a timing chart in FIG. 19, it is also possible to exhibit gray-scale by selecting the same constant current source during a plurality of sub-frame periods of n sub-frame periods in one frame period, and varying the length of the display periods of the respective sub-frame periods for which the same constant current source is selected.

In FIG. 19, the same constant current source $A_1$ is selected for the sub-frame periods $SF_1$ and $SF_2$. At this time, the lengths of display periods $Ts_1$ and $Ts_2$ of the sub-frame periods $SF_1$ and $SF_2$ are different.

As described above, by combining a procedure of varying the length of display periods of different sub-frame periods and a procedure of varying a current flowing between both electrodes (first electrode and second electrode) of the monitor EL element (second EL element) for different sub-frame periods, the display period of lower order bits is set to be long, and the number of constant current sources required for a gray-scale display can be decreased.

Furthermore, in the case where the values of currents output from n (n is a natural number of 2 or more) constant current sources are the same, during one frame period, output terminals of m (m is a natural number of n or less) constant current sources are connected to the first electrode of the monitor EL element (second EL element) during a certain sub-frame period, and output terminals of k (k is a natural number of n or less, different from m) constant current sources are connected to the first electrode of the monitor EL element (second EL element) during another sub-frame period.

Thus, the sum of the output currents from the plurality of selected constant current sources may be set as a current flowing between the first electrode and the second electrode of the monitor EL element (second EL element).

EMBODIMENTS

Hereinafter, embodiments of the present invention will be described.

Embodiment 1

In the present embodiment, a configuration of a buffer amplifier of the display device according to the present invention will be described.

Figure 3:
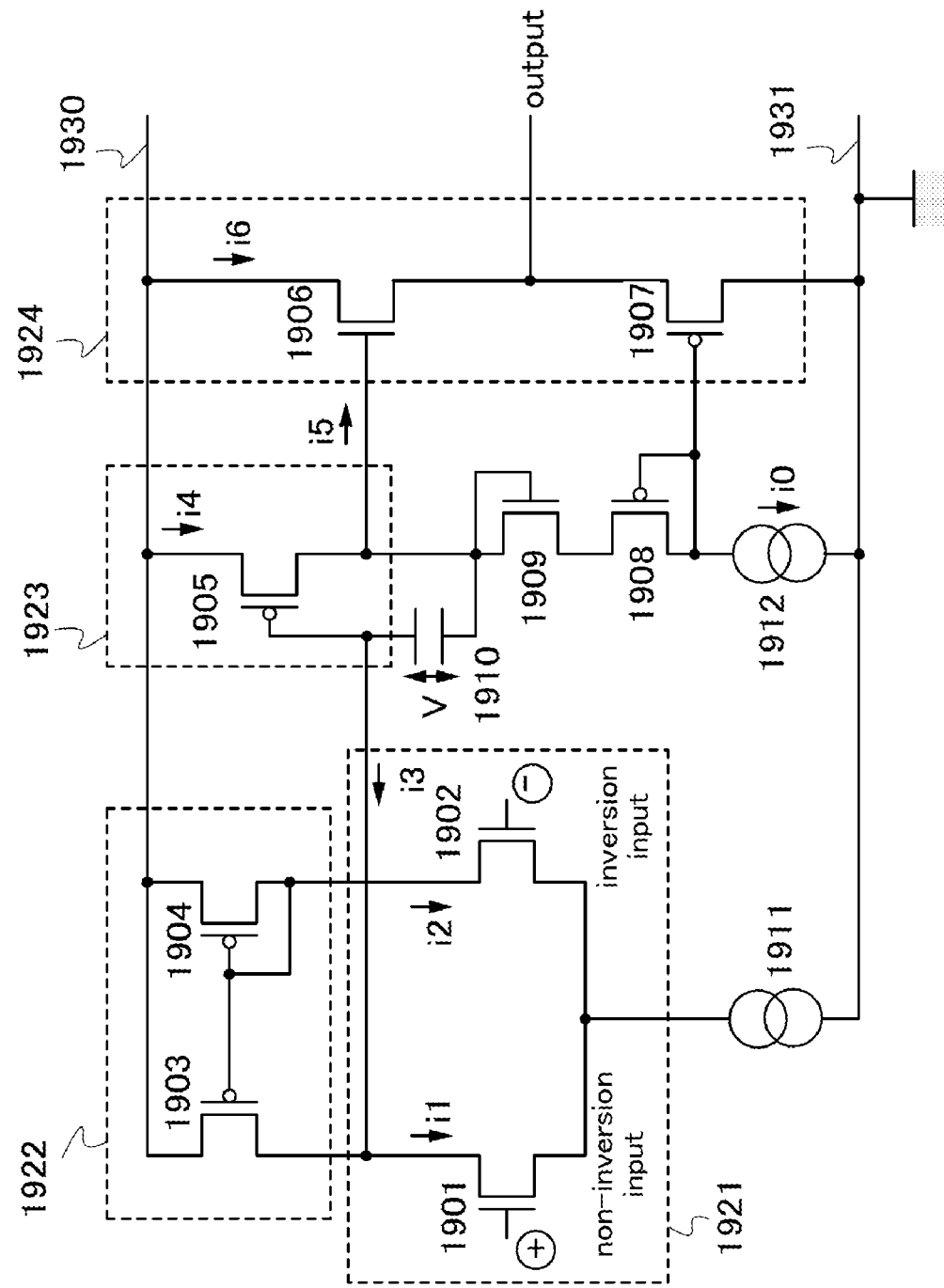
FIG. 3 is a view showing a configuration of a buffer amplifier of the EL display device of the present invention.

FIG. 3 shows an exemplary buffer amplifier produced by using TFTs.

The buffer amplifier is composed of TFTs 1901 to 1909, a capacitor 1910, constant current sources 1911 and 1912, and the like. The TFTs 1901, 1902, 1906, and 1909 are n-channel type TFTs. The TFTs 1903 to 1905, 1907, and 1908 are p-channel type TFTs.

Reference numeral 1930 denotes a higher-potential side power source line, and 1931 denotes a lower-potential side power source line.

Hereinafter, an operation of the buffer amplifier will be described in detail.

A differential amplifier 1921 composed of the TFTs 1901 and 1902 will be described. Because of the difference in voltage input to a gate electrode of the TFT 1901 corresponding to a non-inversion input terminal of the buffer amplifier and a gate electrode of the TFT 1902 corresponding to an inversion input terminal of the buffer amplifier, the amount of a current flowing between a drain and a source of each TFT is varied. These currents are denoted with i1 and i2.

A current mirror circuit 1922 is composed of the TFTs 1903 and 1904. Since a gate electrode of the TFT 1903 is connected to a gate electrode of the TFT 1904, the electric potentials of the gate electrodes of these two TFTs are equal. Therefore, the amount of a current flowing between the source and the drain of the TFT 1903 becomes equal to that of the TFT 1904. Accordingly, a current i3 corresponding to the difference between the currents i1 and i2 flowing through the TFTs 1901 and 1902 of the differential amplifier 1921 must be input to the differential amplifier 1921.

The current i3 is supplied from the capacitor 1910. Because of this, a potential difference V between the electrodes of the capacitor 1910 is increased. The potential difference V is input to a source ground amplifier 1923.

The source ground amplifier 1923 is composed of the TFT 1905. The potential difference V input to the source ground amplifier 1923 becomes a potential difference between a source and a drain of the TFT 1905. A current i4 flows corresponding to the potential difference V. Herein, the constant current source 1912 allows only a constant current i0 to flow. Therefore, a difference i5 between the currents i4 and i0 is input to a source follow buffer circuit 1924. The current i5 is increased corresponding to the amplified potential difference V.

The source follow buffer circuit 1924 is composed of the TFTs 1906 and 1907. An input i5 from the source ground amplifier 1923 is input to a gate electrode of the TFT 1906. Due to the input current i5, the amount of a current i6 flowing between a source and a drain of the TFT 1906 is increased. More specifically, a large current is output from the buffer amplifier.

As described above, the buffer amplifier amplifies and outputs a current.

In the present embodiment, although the differential circuit is composed of an n-channel type TFT, it may be composed of a p-channel type TFT.

Embodiment 2

In Embodiment 2, a method of simultaneously manufacturing TFTs of a pixel portion of display device of the present invention and driving circuit portions provided in the periphery thereof (a source signal line driving circuit and a gate signal line driving circuit). However, in order to simplify the explanation, a CMOS circuit, which is the basic circuit for the driving circuit, is shown in the figures.

First, as shown in FIG. 9A, a base film 5002 made of an insulating film such as a silicon oxide film, a silicon nitride film, or a silicon nitride oxide film is formed on a substrate 5001 made of glass such as barium borosilicate glass or alumino borosilicate glass, typified by #7059 glass or #1737 glass of Corning Inc. For example, a silicon nitride oxide film 5002a fabricated from $SiH_4$, $NH_3$ and $N_2O$ by a plasma CVD method is formed with a thickness of 10 to 200 nm (preferably 50 to 100 nm), and a hydrogenated silicon nitride oxide film 5002b similarly fabricated from $SiH_4$ and $N_2O$ is formed with a thickness of 50 to 200 nm (preferably 100 to 150 nm) to form a lamination. In Embodiment 2, although the base film 5002 is shown as the two-layer structure, the film may be formed of a single layer film of the foregoing insulating film or as a lamination structure of more than two layers.

Island-like semiconductor films 5003 to 5006 are formed of a crystalline semiconductor film manufactured by using a laser crystallization method on a semiconductor film having an amorphous structure, or by using a known thermal crystallization method. The thickness of the island-like semiconductor films 5003 to 5006 is set from 25 to 80 nm (preferably between 30 and 60 nm). There is no limitation on the crystalline semiconductor film material, but it is preferable to form the film from a silicon or a silicon germanium (SiGe) alloy.

A laser such as a pulse oscillation type or continuous emission type excimer laser, a YAG laser, or a YVO$_4$ laser is used for manufacturing the crystalline semiconductor film in the laser crystallization method. A method of condensing laser light emitted from a laser oscillator into a linear shape by an optical system and then irradiating the light to the semiconductor film may be employed when these types of lasers are used. The crystallization conditions may be suitably selected by the operator, but the pulse oscillation frequency is set to 30 Hz, and the laser energy density is set from 100 to 400 mJ/cm$^2$ (typically between 200 and 300 mJ/cm$^2$) when using the excimer laser. Further, the second harmonic is utilized when using the YAG laser, the pulse oscillation frequency is set from 1 to 10 kHz, and the laser energy density may be set from 300 to 600 mJ/cm$^2$ (typically between 350 and 500 mJ/cm$^2$). The laser light which has been condensed into a linear shape with a width of 100 to 1000 μm, for example 400 μm, is then irradiated over the entire surface of the substrate. This is performed with an overlap ratio of 80 to 98% in case of the excimer laser.

Next, a gate insulating film 5007 is formed covering the island-like semiconductor films 5003 to 5006. The gate insulating film 5007 is formed of an insulating film containing silicon with a thickness of 40 to 150 nm by a plasma CVD method or a sputtering method. A 120 nm thick silicon nitride oxide film is formed in Embodiment 2. The gate insulating film 5007 is not limited to such a silicon nitride oxide film, of course, and other insulating films containing silicon may also be used, in a single layer or in a lamination structure. For example, when using a silicon oxide film, it can be formed by the plasma CVD method with a mixture of TEOS (tetraethyl orthosilicate) and O$_2$, at a reaction pressure of 40 Pa, with the substrate temperature set from 300 to 400° C., and by discharging at a high frequency (13.56 MHZ) with electric power density of 0.5 to 0.8 W/cm$^2$. Good characteristics of the silicon oxide film thus manufactured as a gate insulating film can be obtained by subsequently performing thermal annealing at 400 to 500° C.

A first conductive film 5008 and a second conductive film 5009 are then formed on the gate insulating film 5007 in order to form gate electrodes. In Embodiment 2, the first conductive film 5008 is formed from Ta with a thickness of 50 to 100 nm, and the second conductive film 5009 is formed from W with a thickness of 100 to 300 nm.

The Ta film is formed by sputtering, and sputtering of a Ta target is performed by using Ar. If an appropriate amount of Xe or Kr is added to the Ar during sputtering, the internal stress of the Ta film will be relaxed, and film peeling can be prevented. The resistivity of an α phase Ta film is on the order of 20 μΩcm, and the Ta film can be used for the gate electrode, but the resistivity of a β phase Ta film is on the order of 180 μΩcm and the Ta film is unsuitable for the gate electrode. The phase Ta film can easily be obtained if a tantalum nitride film, which possesses a crystal structure near that of α phase Ta, is formed with a thickness of 10 to 50 nm as a base for Ta in order to form the β phase Ta film.

The W film is formed by sputtering with W as a target. The W film can also be formed by a thermal CVD method using tungsten hexafluoride (WF$_6$). Whichever is used, it is necessary to make the film low resistant in order to use it as the gate electrode, and it is preferable that the resistivity of the W film be set 20 μΩcm or less. The resistivity can be lowered by enlarging the crystals of the W film, but for cases where there are many impurity elements such as oxygen within the W film, crystallization is inhibited, and the film becomes high resistant. A W target having a purity of 99.9999% is thus used in sputtering. In addition, by forming the W film while taking sufficient care such that no impurities from the inside of the gas phase are introduced at the time of film formation, a resistivity of 9 to 20 μΩcm can be achieved.

Note that although the first conductive film 5008 and the second conductive film 5009 are formed from Ta and W, respectively, in Embodiment 2, the conductive films are not limited to these. Both the first conductive film 5008 and the second conductive film 5009 may also be formed from an element selected from the group consisting of Ta, W, Ti, Mo, Al, and Cu, or from an alloy material or a chemical compound material having one of these elements as its main constituent. Further, a semiconductor film, typically a polysilicon film, into which an impurity element such as phosphorous is doped, may also be used. Examples of preferable combinations other than that in Embodiment 2 include: the first conductive film formed from tantalum nitride (TaN) and the second conductive film formed from W; the first conductive film formed from tantalum nitride (TaN) and the second conductive film formed from Al; and the first conductive film formed from tantalum nitride (TaN) and the second conductive film formed from Cu.

Next, a mask 5010 is formed from resist, and a first etching process is performed in order to form electrodes and wirings. An ICP (inductively coupled plasma) etching method is used in Embodiment 2. A gas mixture of CF$_4$ and Cl$_2$ is used as an etching gas, and a plasma is generated by applying a 500 W RF electric power (13.56 MHZ) to a coil shape electrode at 1 Pa. A 100 W RF electric power (13.56 MHZ) is also applied to the substrate side (test piece stage), effectively applying a negative self-bias voltage. The W film and the Ta film are both etched on the same order when CF$_4$ and Cl$_2$ are mixed.

Edge portions of the first conductive layer and the second conductive layer are made into a tapered shape in accordance with the effect of the bias voltage applied to the substrate side with the above etching conditions by using a suitable resist mask shape. The angle of the tapered portions is from 15° to 45°. The etching time may be increased by approximately 10 to 20% in order to perform etching without any residue on the gate insulating film. The selectivity of a silicon nitride oxide film with respect to a W film is from 2 to 4 (typically 3), and therefore approximately 20 to 50 nm of the exposed surface of the silicon nitride oxide film is etched by this over-etching process. First shape conductive layers 5011 to 5016 (first conductive layers 5011*a* to 5016*a* and second conductive layers 5011*b* to 5016*b*) are thus formed of the first conductive layer and the second conductive layer by the first etching process. At this point, regions of the gate insulating film 5007 not covered by the first shape conductive layers 5011 to 5016 are made thinner by approximately 20 to 50 nm by etching. (FIG. 9B)

Then, a first doping process is performed to add an impurity element for imparting a n-type conductivity. (FIG. 9B) Doping may be carried out by an ion doping method or an ion injecting method. The condition of the ion doping method is that a dosage is $1 \times 10^{13}$ to $5 \times 10^{14}$ atoms/cm$^2$, and an acceleration voltage is 60 to 100 keV. As the impurity element for imparting the n-type conductivity, an element belonging to group 15, typically phosphorus (P) or arsenic (As) is used, but phosphorus is used here. In this case, the conductive layers 5011 to 5015 become masks to the impurity element to impart the n-type conductivity, and first impurity regions 5017 to 5025 are formed in a self-aligning manner. The impurity element to impart the n-type conductivity in the concentration range of $1 \times 10^{20}$ to $1 \times 10^{21}$ atoms/cm$^3$ is added to the first impurity regions 5017 to 5025.

Next, as shown in FIG. 9C, a second etching process is performed without removing the mask formed from resist.

The etching gas of the mixture of $CF_4$, $Cl_2$ and $O_2$ is used, and the W film is selectively etched. At this point, second shape conductive layers 5026 to 5031 (first conductive layers 5026a to 5031a and second conductive layers 5026b to 5031b) are formed by the second etching process. Regions of the gate insulating film 5007, which are not covered with the second shape conductive layers 5026 to 5031 are made thinner by about 20 to 50 nm by etching.

An etching reaction of the W film or the Ta film by the mixture gas of $CF_4$ and $Cl_2$ can be guessed from a generated radical or ion species and the vapor pressure of a reaction product. When the vapor pressures of fluoride and chloride of W and Ta are compared with each other, the vapor pressure of $WF_6$ of fluoride of W is extremely high, and other $WCl_5$, $TaF_5$, and $TaCl_5$ have almost equal vapor pressures. Thus, in the mixture gas of $CF_4$ and $Cl_2$, both the W film and the Ta film are etched. However, when a suitable amount of $O_2$ is added to this mixture gas, $CF_4$ and $O_2$ react with each other to form CO and F, and a large number of F radicals or F ions are generated. As a result, an etching rate of the W film having the high vapor pressure of fluoride is increased. On the other hand, with respect to Ta, even if F is increased, an increase of the etching rate is relatively small. Besides, since Ta is easily oxidized as compared with W, the surface of Ta is oxidized by addition of $O_2$. Since the oxide of Ta does not react with fluorine or chlorine, the etching rate of the Ta film is further decreased. Accordingly, it becomes possible to make a difference between the etching rates of the W film and the Ta film, and it becomes possible to make the etching rate of the W film higher than that of the Ta film.

Then, as shown in FIG. 10A, a second doping process is performed. In this case, a dosage is made lower than that of the first doping process and under the condition of a high acceleration voltage, an impurity element for imparting the n-type conductivity is doped. For example, the process is carried out with an acceleration voltage set to 70 to 120 keV and at a dosage of $1 \times 10^{13}$ atoms/cm$^2$, so that new impurity regions are formed inside of the first impurity regions formed into the island-like semiconductor layers in FIG. 9B. Doping is carried out such that the second shape conductive layers 5026 to 5030 are used as masks to the impurity element and the impurity element is added also to the regions under the first conductive layers 5026a to 5030a. In this way, third impurity regions 5032 to 5036 are formed. The concentration of phosphorous (P) added to the third impurity regions has a gentle concentration gradient in accordance with the thickness of tapered portions of the first conductive layers 5026a to 5030a. Note that in the semiconductor layer that overlap with the tapered portions of the first conductive layers 5026a to 5030a, the concentration of impurity element slightly falls from the end portions of the tapered portions of the first conductive layers 5026a to 5030a toward the inner portions, but the concentration keeps almost the same level.

As shown in FIG. 10B, a third etching process is performed. This is performed by using a reactive ion etching method (RIE method) with an etching gas of $CHF_3$. The tapered portions of the first conductive layers 5026a to 5031a are partially etched, and the region in which the first conductive layers overlap with the semiconductor layer is reduced by the third etching process. Third shape conductive layers 5037 to 5042 (first conductive layers 5037a to 5042a and second conductive layers 5037b to 5042b) are formed. At this point, regions of the gate insulating film 5007, which are not covered with the third shape conductive layers 5037 to 5042 are made thinner by about 20 to 50 nm by etching.

By the third etching process, in the third impurity regions 5032 to 5036 before performed the third etching process, third impurity regions 5032a to 5036a, which overlap with the first conductive layers 5037a to 5042a, and second impurity regions 5032b to 5236b between the first impurity regions and the third impurity regions are formed.

Then, as shown in FIG. 10C, fourth impurity regions 5043 to 5054 having a conductivity type opposite to the first conductivity type are formed in the island-like semiconductor layers 5004 and 5006 forming p-channel TFTs. The third conductive layers 5038b and 5041b are used as masks to an impurity element, and the impurity regions are formed in a self-aligning manner. At this time, the whole surfaces of the island-like semiconductor layers 5003, 5005 and the wiring portion 5042, which form n-channel TFTs are covered with a resist mask 5200. Phosphorus is added to the impurity regions 5043 to 5054 at different concentrations, respectively. The regions are formed by an ion doping method using diborane ($B_2H_6$) and the impurity concentration is made $2 \times 10^{20}$ to $2 \times 10^{21}$ atoms/cm$^3$ in any of the regions.

By the steps up to this, the impurity regions are formed in the respective island-like semiconductor layers. The third shape conductive layers 5037 to 5041 overlapping with the island-like semiconductor layers function as gate electrodes. The conductive layer 5042 functions as an island-like source signal line.

After the resist mask 5200 is removed, a step of activating the impurity elements added in the respective island-like semiconductor layers for the purpose of controlling the conductivity type. This step is carried out by a thermal annealing method using a furnace annealing oven. In addition, a laser annealing method or a rapid thermal annealing method (RTA method) can be applied. The thermal annealing method is performed in a nitrogen atmosphere having an oxygen concentration of 1 ppm or less, preferably 0.1 ppm or less and at 400 to 700° C., typically 500 to 600° C. In Embodiment 2, a heat treatment is conducted at 500° C. for 4 hours. However, in the case where a wiring material used for the third conductive layers 5037 to 5042 is weak to heat, it is preferable that the activation is performed after an interlayer insulating film (containing silicon as its main ingredient) is formed to protect the wiring line or the like.

Further, a heat treatment at 300 to 450° C. for 1 to 12 hours is conducted in an atmosphere containing hydrogen of 3 to 100%, and a step of hydrogenating the island-like semiconductor layers is conducted. This step is a step of terminating dangling bonds in the semiconductor layer by thermally excited hydrogen. As another means for hydrogenation, plasma hydrogenation (using hydrogen excited by plasma) may be carried out.

Figure 11A:
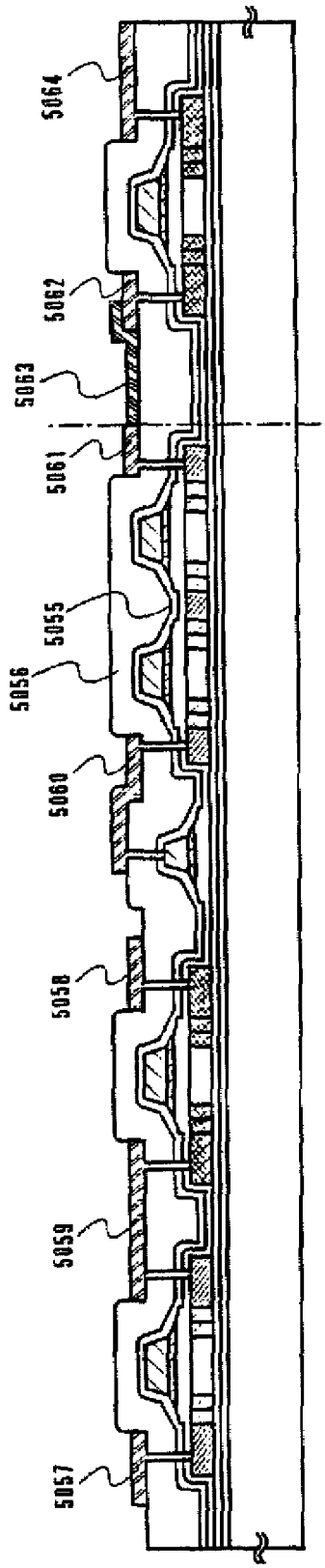
FIGS. 11A and 11B show the steps of producing the EL display device of the present invention.

Next, as shown in FIG. 11A, a first interlayer insulating film 5055 having a thickness of 100 to 200 nm is formed of a silicon nitride oxide film. A second interlayer insulating film 5056 made of an organic insulator material is formed thereon. Contact holes are then formed with respect to the first interlayer insulating film 5055, the second interlayer insulating film 5056, and the gate insulating film 5007, respective wirings (including connection wirings and signal lines) 5057 to 5062, and 5064 are formed by patterning, and then, a pixel electrode 5063 that contacts with the connection wiring 5062 is formed by patterning.

Next, the film made from organic resin is used for the second interlayer insulating film 5056. As the organic resin, polyimide, polyamide, acryl, BCB (benzocyclobutene) or the like can be used. Especially, since the second interlayer insulating film 5056 has rather the meaning of flattening, acryl excellent in flatness is desirable. In Embodiment 2, an acryl film is formed to such a thickness that stepped portions formed by the TFTs can be adequately flattened. The thickness is preferably made 1 to 5 μm (more preferably 2 to 4 μm).

In the formation of the contact holes, dry etching or wet etching is used, and contact holes reaching the n-type impurity regions 5017, 5018, 5021 and 5023 or the p-type impurity regions 5043 to 5054, a contact hole reaching the wiring 5042, a contact hole reaching the power source supply line (not shown), and contact holes reaching the gate electrodes (not shown) are formed, respectively.

Further, a lamination film of a three layer structure, in which a 100 nm thick Ti film, a 300 nm thick aluminum film containing Ti, and a 150 nm thick Ti film are formed in succession by sputtering, is patterned into a desirable shape, and the resultant lamination film is used as the wirings (including connection wirings) 5057 to 5062, and 5064. Of course, other conductive films may be used.

Furthermore, in Embodiment 2, an ITO film is formed with a thickness of 110 nm, and patterning is performed to form the pixel electrode 5063. The pixel electrode 5063 is arranged so as to contact and overlap the connection wiring 5062 so that contact is obtained. Further, a transparent conductive film in which zinc oxide (ZnO) of 2 to 20% is mixed with indium oxide may be used. This pixel electrode 5063 corresponds to an anode of an EL element. (FIG. 11A)

Figure 11B:
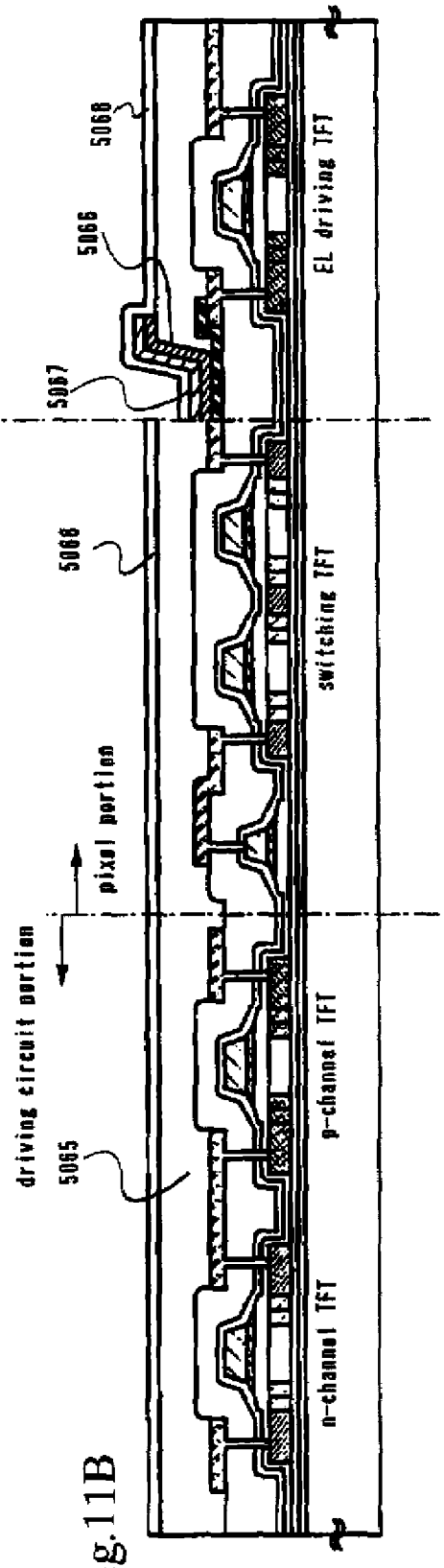

Next, as shown in FIG. 11B, an insulating film containing silicon (a silicon oxide film in Embodiment 2) is formed with a thickness of 500 nm, an opening portion is formed at the position corresponding to the pixel electrode 5063, and then, a third interlayer insulating film 5065 that functions as a bank is formed. In forming the opening portion, side walls having a tapered shape may be easily formed by using wet etching. The deterioration of the EL layer due to stepped portion becomes a remarkable problem if the side walls of the opening portion are sufficiently flat.

An EL layer 5066 and a cathode (MgAg electrode) 5067 are formed next in succession, without exposure to the atmosphere, using a vacuum evaporation method. Note that the film thickness of the EL layer 5066 may be set from 80 to 200 nm (typically between 100 and 120 nm), and the thickness of the cathode 5067 may be set from 180 to 300 nm (typically 200 to 250 nm).

The EL layer and the cathode are formed one after another with respect to pixels corresponding to the color red, pixels corresponding to the color green, and pixels corresponding to the color blue. However, the EL layer is weak with respect to a solution, and therefore the EL layer and the cathode must be formed with respect to each of the colors without using a photolithography technique. It is preferable to cover areas outside of the desired pixels using a metal mask, and selectively form the EL layer and the cathode only in the necessary locations.

In other words, a mask is first set so as to cover all pixels except for those corresponding to the color red, and the EL layer for emitting red color light is selectively formed using the mask. Next, a mask is set so as to cover all pixels except for those corresponding to the color green, and the EL layer for emitting green color light is selectively formed using the mask. Similarly, a mask is set so as to cover all pixels except for those corresponding to the color blue, and the EL layer for emitting blue color light is selectively formed using the mask. Note that the use of all different masks is stated here, but the same mask may also be reused.

The method of forming three kinds of EL elements corresponding to the colors RGB is used here, but a method of combining a white color light emitting EL element and a color filter, a method of combining a blue or blue-green color light emitting EL element and a fluorescing body (fluorescing color conversion layer: CCM), a method of using a transparent electrode as a cathode (opposing electrode) and overlapping it with EL elements each corresponding to one of the colors RGB and the like may be used.

A known material can be used as the EL layer 5066. Considering the driving voltage, it is preferable to use an organic material as the known material. For example, a four layer structure constituted of a hole injecting layer, a hole transporting layer, a light emitting layer and an electron injecting layer may be adopted as an EL layer.

Next, the cathode 5067 is formed using a metal mask on the pixels having the switching TFTs of which the gate electrodes are connected to the same gate signal line (pixels on the same line). Note that, in Embodiment 2, although MgAg is used as the cathode 5067, the present invention is not limited to this. Other known materials may be used for the cathode 5067.

Finally, a passivation film 5068 made of a silicon nitride film is formed with a thickness of 300 nm. The formation of the passivation film 5068 enables the EL layer 5066 to be protected against moisture and the like, and the reliability of the EL element can further be enhanced.

According to above-mentioned steps, the monitor EL element for (second EL element) can be formed simultaneously with the EL element (first EL element) of the pixel on the same substrate.

Consequently, the EL display device with the structure as shown in FIG. 11B is completed. Note that, in the manufacturing process of the EL display device in Embodiment 2, the source signal lines are formed from Ta and W, which are materials for forming gate electrodes, and the gate signal lines are formed from Al, which is a material for forming wirings, but different materials may be used.

Incidentally, the EL display device in Embodiment 2 exhibits the very high reliability and has the improved operational characteristic by providing TFTs having the most suitable structure in not only the pixel portion but also the driving circuit portion. Further, it is also possible to add a metallic catalyst such as Ni in the crystallization process, thereby increasing crystallinity. It therefore becomes possible to set the driving frequency of the source signal line driving circuit to 10 MHZ or higher.

First, a TFT having a structure in which hot carrier injection is reduced without decreasing the operating speed as much as possible is used as an n-channel TFT of a CMOS circuit forming the driving circuit portion. Note that the driving circuit referred to here includes circuits such as a shift register, a buffer, a level shifter, a latch in line-sequential drive, and a transmission gate in dot-sequential drive.

In Embodiment 2, the active layer of the n-channel TFT contains the source region, the drain region, the LDD region overlapping with the gate electrode with the gate insulating film sandwiched therebetween (Lov region), the offset LDD region not overlapping with the gate electrode with the gate insulating film sandwiched therebetween (Loff region), and the channel forming region.

Further, there is not much need to worry about degradation due to the hot carrier injection with the p-channel TFT of the CMOS circuit, and therefore LDD regions may not be formed in particular. It is of course possible to form LDD regions similar to those of the n-channel TFT, as a measure against hot carriers.

In addition, when using a CMOS circuit in which electric current flows in both directions in the channel forming region, namely a CMOS circuit in which the roles of the source region and the drain region interchange, it is preferable that LDD regions be formed on both sides of the channel forming region of the n-channel TFT forming the CMOS circuit, sandwiching the channel forming region. A circuit such as a transmission gate used in dot-sequential drive can be given as an example of such. Further, when a CMOS circuit in which it is necessary to suppress the value of the off current as much as possible is used, the n-channel TFT forming the CMOS circuit preferably has an Lov region. A circuit such as the transmission gate used in dot-sequential drive can be given as an example of such.

Note that, in practice, it is preferable to perform packaging (sealing), without exposure to the atmosphere, using a protecting film (such as a laminated film or an ultraviolet cured resin film) having good airtight properties and little outgassing, or a transparent sealing material, after completing through the state of FIG. 11B. At this time, the reliability of the EL element is increased by making an inert atmosphere on the inside of the sealing material and by arranging a drying agent (barium oxide, for example) inside the sealing material.

Further, after the airtight properties have been increased by the packaging process, a connector (flexible printed circuit: FPC) is attached in order to connect terminals led from the elements or circuits formed on the substrate with external signal terminals. Then, a finished product is completed. This state at which the product is ready for shipment is referred to as a display device throughout this specification.

Furthermore, in accordance with the process shown in Embodiment 2, the number of photo masks required for manufacture of a display device can be suppressed. As a result, the process can be shortened, and the reduction of the manufacturing cost and the improvement of the yield can be attained.

Embodiment 3

In this embodiment, an example in which an EL display device of the present invention is fabricated will be described.

Figure 12A:
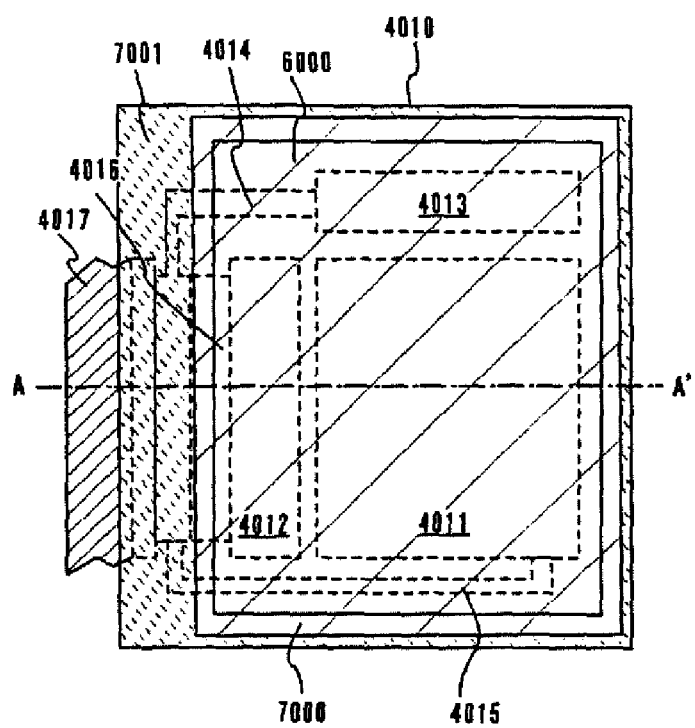
FIGS. 12A and 12B are a top view and a cross-sectional view of the EL display device of the present invention.

FIG. 12A is a top view of an active EL display device using the present invention. In FIG. 12A, reference numeral 4010 designates a substrate; 4011, a pixel portion; 4012, a source signal line driving circuit; and 4013, a gate signal line driving circuit, and the pixel portion and the respective driving circuits lead to an FPC 4017 through wirings 4014 to 4016 and are connected to an external equipment.

At this time, a cover member 6000, a seal member (also called a housing member) 7000, and a sealant (second seal member) 7001 are provided so as to surround at least the pixel portion, preferably the driving circuits and the pixel portion.

Figure 12B:
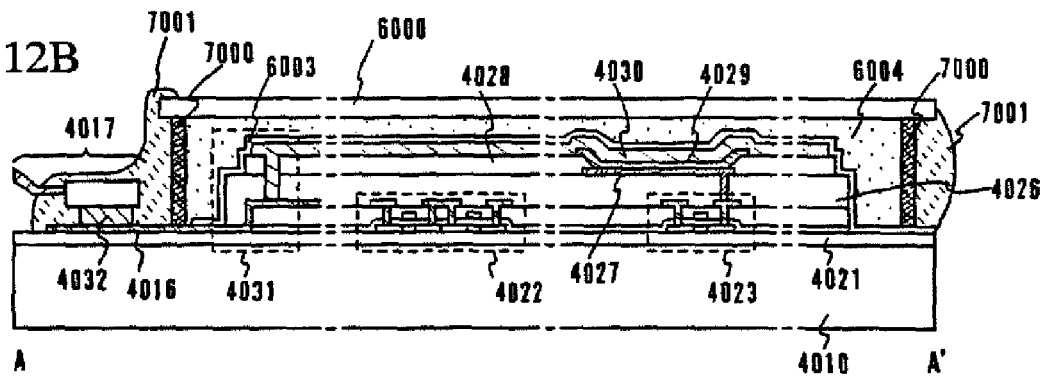

FIG. 12B is a view showing a sectional structure of the EL display device of this embodiment. A driving circuit TFT (here, a CMOS circuit of a combination of an n-channel TFT and a p-channel TFT is shown) 4022 and a pixel portion TFT 4023 are formed on the substrate 4010 and a base film 4021. These TFTs may be formed by using a well-known structure (top gate structure or bottom gate structure).

When the driving circuit TFT 4022 and the pixel portion TFT 4023 are completed, a pixel electrode 4027 electrically connected to a drain of the pixel portion TFT 4023 and made of a transparent conductive film is formed on an interlayer insulating film (leveling film) 4026 made of resin material. As the transparent conductive film, a compound (called ITO) of indium oxide and tin oxide or a compound of indium oxide and zinc oxide can be used. After the pixel electrode 4027 is formed, an insulating film 4028 is formed, and an opening portion is formed on the pixel electrode 4027.

Next, an EL layer 4029 is formed. As the EL layer 4029, a laminate structure or a single layer structure may be adopted by freely combining well-known EL materials (hole injection layer, hole transport layer, light emitting layer, electron transport layer, and electron injection layer). A well-known technique may be used to determine the structure. The EL material includes a low molecular material and a high molecular (polymer) material. In the case where the low molecular material is used, an evaporation method is used. In the case where the high molecular material is used, it is possible to use a simple method such as a spin coating method, a printing method or an ink jet method.

In this embodiment, the EL layer is formed by the evaporation method using a shadow mask. Color display becomes possible by forming light emitting layers (red light emitting layer, green light emitting layer, and blue light emitting layer), which can emit lights with different wavelengths, for every pixel by using the shadow mask. In addition, there are a system in which a color conversion layer (CCM) and a color filter are combined, and a system in which a white light emitting layer and a color filter are combined, and either system may be used. Of course, an EL display device of monochromatic light emission may be used.

After the EL layer 4029 is formed, a cathode 4030 is formed thereon. It is desirable to remove moisture and oxygen existing in the interface between the cathode 4030 and the EL layer 4029 to the utmost. Thus, it is necessary to make such contrivance that the EL layer 4029 and the cathode 4030 are continuously formed in vacuum, or the EL layer 4029 is formed in an inert gas atmosphere and the cathode 4030 is formed without releasing to the atmosphere. In this embodiment, a film formation apparatus of a multi-chamber system (cluster tool system) is used, so that the foregoing film formation is made possible.

Incidentally, in this embodiment, a laminate structure of a LiF (lithium fluoride) film and an Al (aluminum) film is used for the cathode 4030. Specifically, the LiF (lithium fluoride) film having a thickness of 1 nm is formed on the EL layer 4029 by the evaporation method, and the aluminum film having a thickness of 300 nm is formed thereon. Of course, a MgAg electrode of a well-known cathode material may be used. The cathode 4030 is connected to the wiring 4016 in a region designated by 4031. The wiring 4016 is a power supply line for giving a predetermined voltage to the cathode 4030, and is connected to the FPC 4017 through a conductive paste material 4032.

For the purpose of electrically connecting the cathode 4030 to the wiring 4016 in the region 4031, it is necessary to form contact holes in the interlayer insulating film 4026 and the insulating film 4028. These may be formed at the time of etching the interlayer insulating film 4026 (at the time of forming the contact hole for the pixel electrode) and at the time of etching the insulating film 4028 (at the time of forming the opening portion before formation of the EL layer). When the insulating film 4028 is etched, the interlayer insulating film 4026 may be etched together. In this case, if the interlayer insulating film 4026 and the insulating film 4028 are made of the same resin material, the shape of the contact hole can be made excellent.

A passivation film 6003, a filler 6004, and a cover member 6000 are formed to cover the surface of the EL element formed in this way.

Further, the seal member 7000 is provided between the cover member 6000 and the substrate 4010 in order to cover the EL element portion, and further, the sealant (second seal member) 7001 is formed at the outside of the seal member 7000.

At this time, this filler 6004 functions also as an adhesive for bonding the cover member 6000. As the filler 6004, PVC (polyvinylchloride), epoxy resin, silicone resin, PVB (polyvinyl butyral) or EVA (ethylene-vinyl acetate) can be used. It is preferable that a drying agent is provided in the inside of this filler 6004, since a moisture absorption effect can be held.

A spacer may be contained in the filler 6004. At this time, the spacer may be made a granular material of BaO or the like, and the spacer itself may be made to have a moisture absorption property.

In the case where the spacer is provided, the passivation film 6003 can relieve spacer pressure. In addition to the passivation film 6003, a resin film or the like for relieving the spacer pressure may be provided.

As the cover member 6000, a glass plate, an aluminum plate, a stainless plate, an FRP (Fiberglass-Reinforced Plastics) plate, a PVF (polyvinyl fluoride) film, a Mylar film, a polyester film, or an acryl film can be used. In the case where PVB or EVA is used for the filler 6004, it is preferable to use a sheet with a structure in which an aluminum foil with several tens of mm is put between PVF films or Mylar films.

However, according to the direction of light emission (radiation direction of light) from the EL element, it is necessary that the cover member 6000 has transparency.

The wiring 4016 is electrically connected to the FPC 4017 through the gap between the substrate 4010 and the seal member 7000 or the sealant 7001. Incidentally, here, although the description has been made on the wiring line 4016, the other wiring lines 4014 and 4015 are also electrically connected to the FPC 4017 through a space under the seal member 7000 and the sealant 7001 in the same way.

Note that the cover member 6000 is bonded after providing the filling material 6004 and that the sealing material 7000 is attached so as to cover the side surface (exposed surface) of the filling material 6004 in Embodiment 3, but the filling material 6004 may also be formed after attaching the cover member 6000 and the sealing material 7000. In this case, a filling material injection port passing through the gap formed by the substrate 4010, the cover member 6000 and the sealing material 7000 is formed. The gap is then placed in a vacuum state (equal to or less than $10^{-2}$ Torr), and after immersing the injection port in a tank containing the filling material, the pressure outside of the gap is made higher than the pressure within the gap, and the filling material fills the space.

Embodiment 4

In this embodiment, an example in which an EL display device different from FIGS. 12 and 12B is fabricated by using the present invention will be described with reference to FIGS. 13A and 13B. Since the same reference numerals as those of FIGS. 12A and 12B designate the same portions, the explanation is omitted.

Figure 13A:
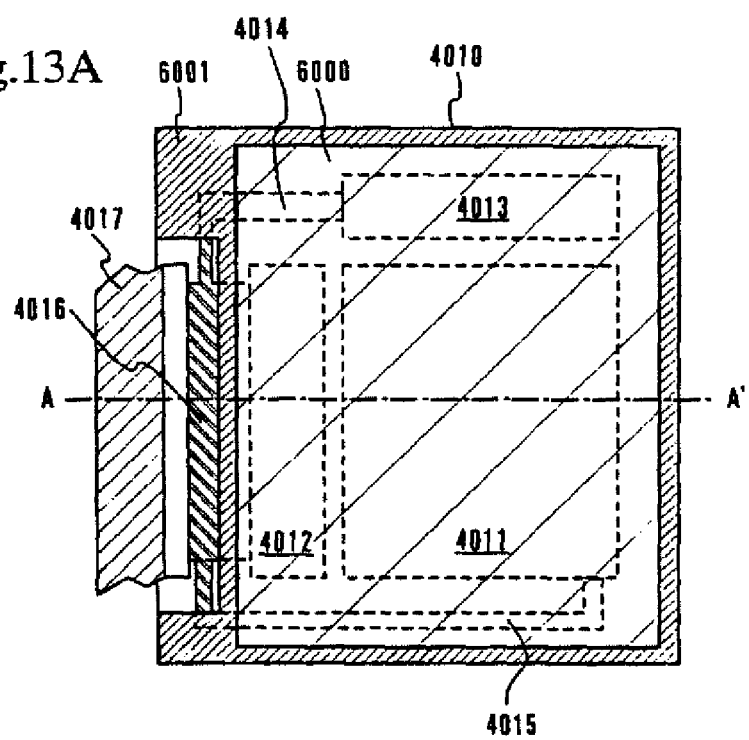
FIGS. 13A and 13B show a top view and a cross-sectional view of the EL display device of the present invention.
Figure 13B:
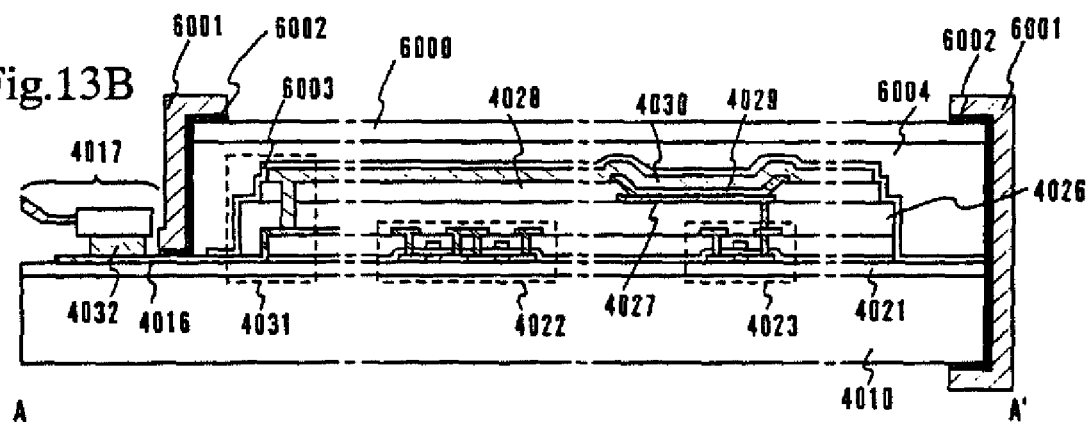

FIG. 13A is a top view of an EL display device of this embodiment, and FIG. 13A is a sectional view taken along line A-A' of FIG. 13A.

In accordance with FIG. 12, steps are carried out until a passivation film 6003 covering the surface of an EL element is formed.

Further, a filler 6004 is provided so as to cover the EL element. This filler 6004 functions also as an adhesive for bonding a cover member 6000. As the filler 6004, PVC (polyvinyl chloride), epoxy resin, silicone resin, PVB (polyvinyl butyral) or EVA (ethylene-vinyl acetate) can be used. Also, it is preferable that a drying agent is provided in the inside of this filler 6004, since a moisture absorption effect can be held.

A spacer may be contained in the filler 6004. At this time, the spacer may be made a granular material of BaO or the like, and the spacer itself may be made to have a moisture absorption property.

In the case where the spacer is provided, the passivation film 6003 can relieve spacer pressure. In addition to the passivation film, a resin film or the like for relieving the spacer pressure may be provided.

As the cover member 6000, a glass plate, an aluminum plate, a stainless plate, an FRP (Fiberglass-Reinforced Plastics) plate, a PVF (polyvinyl fluoride) film, a Mylar film, a polyester film, or an acryl film can be used. In the case where PVB or EVA is used for the filler 6004, it is preferable to use a sheet with a structure in which an aluminum foil with several tens of μm is put between PVF films or Mylar films.

However, according to the direction of light emission (radiation direction of light) from the EL element, it is necessary that the cover member 6000 has transparency.

Next, after the cover member 6000 is bonded by using the filler 6004, a frame member 6001 is attached so as to cover the side (exposed surface) of the filler 6004. The frame member 6001 is bonded by a seal member (functioning as an adhesive) 6002. At this time, as the seat member 6002, although it is preferable to use a photo-curing resin, if heat resistance of the EL layer permits, a thermosetting resin may be used. Incidentally, it is desirable that the seal member 6002 is a material which is as impermeable as possible to moisture and oxygen. A drying agent may be added in the inside of the seal member 6002.

A wiring line 4016 is electrically connected to an FPC 4017 through a gap between the seal member 6002 and a substrate 4010. Here, although description has been made on the wiring 4016, other wirings 4014 and 4015 are also electrically connected to the FPC 4017 through a gap between the seal member 6002 in the same manner.

Note that the cover member 6000 is bonded after forming the filling material 6004 and that the frame material 6001 is attached so as to cover the side surface (exposed surface) of the filling material 6004 in Embodiment 4, but the filling material 6004 may also be formed after attaching the cover member 6000 and the frame material 6001. In this case, a filling material injection port passing through the gap formed by the substrate 4010, the cover member 6000 and the frame material 6001 is formed. The gap is then placed in a vacuum state (equal to or less than $10^{-2}$ Torr), and after immersing the injection port in a tank containing the filling material, the pressure on the outside of the gap is made higher than the pressure within the gap, and the filling material fills the space.

Embodiment 5

Here, an example of a pixel portion structure of an EL display device is shown in this embodiment.

Figure 14:
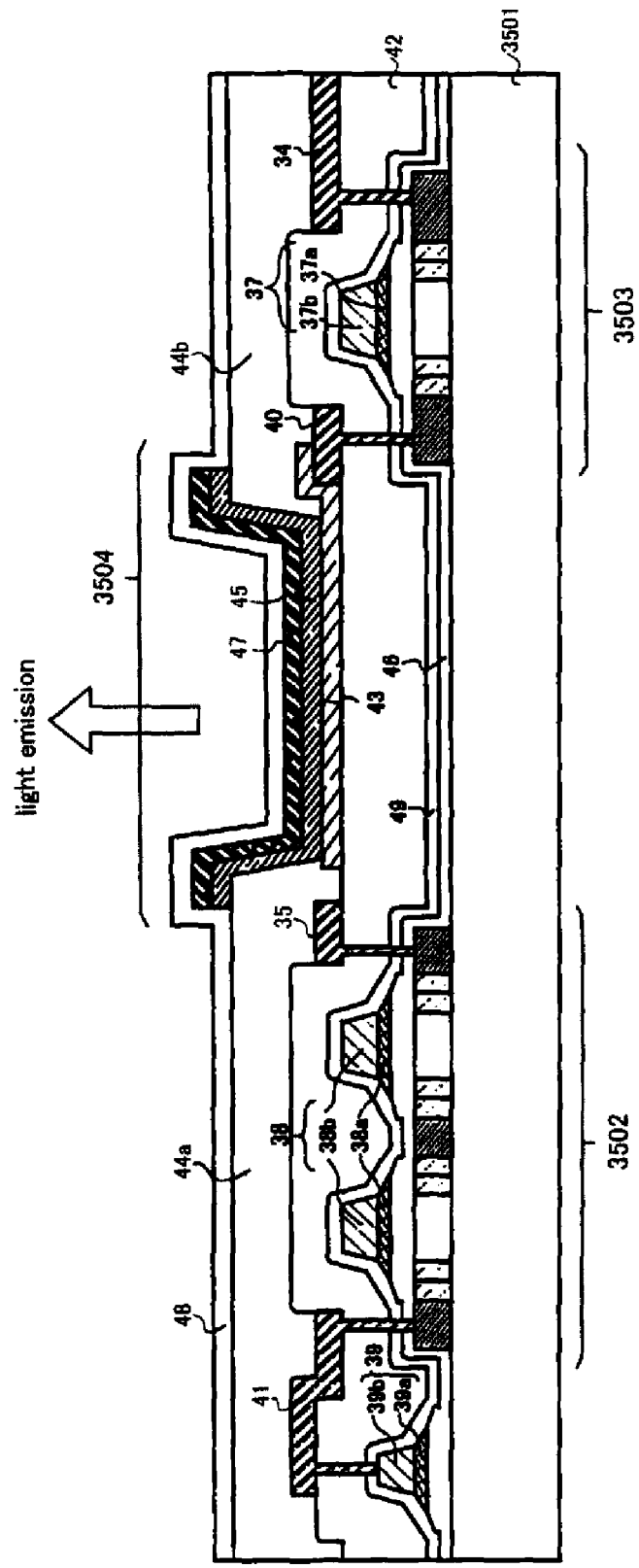
FIG. 14 is a cross-sectional view of the EL display device of the present invention.

FIG. 14 illustrates a further detailed structure in cross section of a pixel portion. In FIG. 14, a switching TFT 3502 provided on a substrate 3501 is formed by a known method. Reference numeral 46 is a gate insulating film. In the present embodiment, the switching TFT 3502 has a double gate structure. It is to be noted that, though the double gate structure is adopted in the present embodiment, a single gate structure, a triple gate structure, or a multiple gate structure having more than three gates may also be adopted.

In the present embodiment, the gate electrode of the switching TFT 38 has a lamination structure composed of first conductive layer 38a and second conductive layer 38b.

An EL driving TFT 3503 is an n-channel TFT formed by a known method. The source wiring 41 of the switching TFT is connected to the source signal line 39. Further in this embodiment, a source signal line has a lamination structure composed of first conductive layer 39a and second conductive layer 39b. The drain wiring 35 of the switching TFT 3502 is electrically connected to the gate electrode 37 of the EL driving TFT 3503. The drain wiring 40 of the EL driving TFT 3503 is connected to a cathode 43 of an EL element. Further, the source wiring 34 of the EL driving TFT 3503 is connected to the power source supply line (not illustrated), and constant voltage is applied to the source wiring 34.

Further, although the EL driving TFT 3503 with a single gate structure is shown in this embodiment, a multi-gate structure in which a plurality of TFTs are connected in series may also be used. In addition, a structure in which a plurality of TFTs are connected in parallel to substantially partition a channel forming region, and which can perform radiation of heat with high efficiency, may also be used. This structure is effective as a means against degradation due to heat.

In this embodiment, the gate electrode of the EL driving TFT has a lamination structure composed of first conductive layer 37a and second conductive layer 37b.

A leveling film 42 comprising an interlayer insulating film 49 and an insulating resin film is formed on the switching TFT 3502 and the EL driving TFT 3503. It is extremely important to level the step due to the TFTs using the leveling film 42. An EL layer formed later is extremely thin, so there are cases in which defective light emissions occur. Therefore, in order to form the EL layer with as level a surface as possible, it is preferable to perform leveling before forming a pixel electrode.

Furthermore, reference numeral 43 denotes a pixel electrode (a cathode of the EL element) of a conductive film with high reflectivity. It is preferable to use a low resistance conductive film, such as an aluminum alloy film, a copper alloy film, and a silver alloy film, or a laminate of such films. Of course, a lamination structure with another conductive film may also be used.

In addition, a light emitting layer 45 is formed in a groove formed by banks 44a and 44b of insulating films (preferably resins). Note that only one pixel is shown in the figure here, but the light emitting layer may be divided to correspond to each of the colors R (red), G (green), and B (blue). A π-conjugation polymer material is used as an organic EL material. Polyparaphenylene vinylenes (PPVs), polyvinyl carbazoles (PVKs), and polyfluoranes can be given as typical polymer materials.

Note that there are several types of PPV organic EL materials, and materials recorded in Shenk, H., Becker, H., Gelsen, O., Kluge, E., Kreuder, W., and Spreitzer, H., Polymers for Light Emitting Diodes, Euro Display Proceedings, 1999, pp. 33-37, and in Japanese Patent Application Laid-open No. Hei 10-92567, for example, may be used.

As specific light emitting layers, cyano-polyphenylene vinylene may be used as a red light emitting layer, polyphenylene vinylene may be used as a green light emitting layer, and polyphenylene vinylene or polyalkylphenylene may be used as a blue light emitting layer. The film thickness may be between 30 and 150 nm (preferably between 40 and 100 nm).

However, the above example is one example of the organic EL materials which can be used as light emitting layers, and it is not necessary to limit use to these materials. An EL layer (layer in which light emission and movement of carriers for the light emission are performed) may be formed by freely combining light emitting layers, electric charge transport layers, and electric charge injection layers.

For example, although the present embodiment shows an example of using a polymer material as a light emitting layer, a low molecular weight organic EL material may also be used. Further, it is possible to use inorganic materials such as silicon carbide, as an electric charge transport layer or an electric charge injection layer. Known materials can be used for these organic EL materials and inorganic materials.

An anode 47 is then formed on the light emitting layer 45 of a transparent conductive film in the present embodiment. The light generated by the light emitting layer 45 is radiated toward the upper surface (the direction toward the upper side of the TFT) in this embodiment, and therefore the anode must have a property of being transparent to light. A compound of indium oxide and tin oxide, or a compound of an indium oxide and zinc oxide can be used as the transparent conductive film. However, since it is formed after forming light emitting and hole injection layers with the low heat resistance, it is preferable to use a material which can be deposited at as low a temperature as possible.

An EL element 3504 is completed when the anode 47 is formed. Note that what is called the EL element 3504 here is formed by the pixel electrode (cathode) 43, the light emitting layer 45, and the anode 47.

In addition, a passivation film 48 is then formed on the anode 47 in this embodiment. It is preferable to use a silicon nitride film or an oxidized silicon nitride film as the passivation film 48. The purpose is the isolation of the EL element from the outside, and it is meaningful in preventing degradation due to oxidation of the organic EL material, and in controlling gaseous emitted from the organic EL material. The reliability of the EL display device can thus be raised.

Embodiment 6

Figure 15:
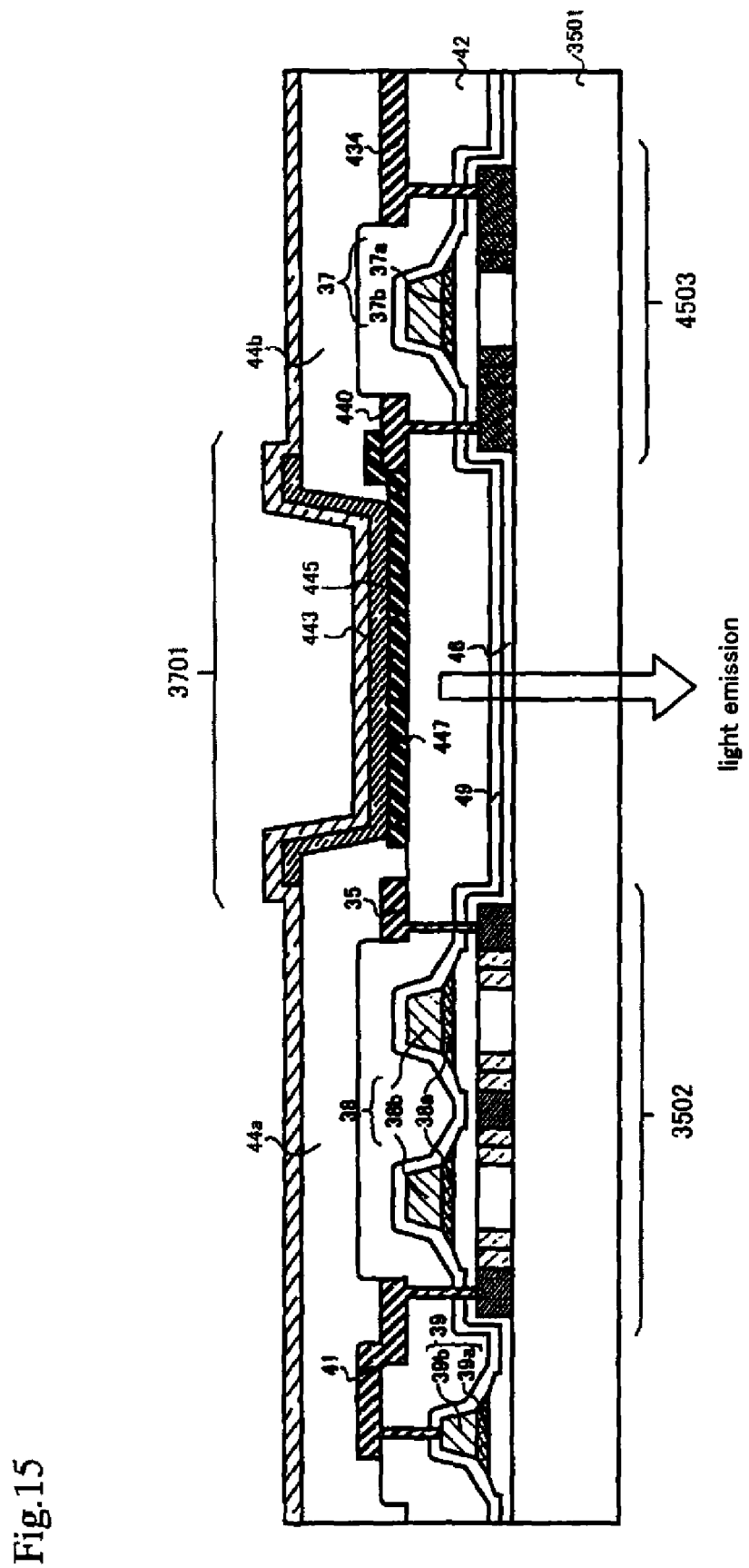
FIG. 15 is a cross-sectional view of the EL display device of the present invention.

In the present embodiment, the case will be described with reference to FIG. 15, in which the configuration of the EL element 3504 is inverted in the pixel portion shown in Embodiment 5. The configuration in FIG. 15 is different from that in FIG. 14 only in an EL element portion and an EL driving TFT. Therefore, the description of the remaining components will be omitted here.

In FIG. 15, an EL driving TFT 4503 is a p-channel type TFT, and can be produced in accordance with a known method. In the present embodiment, a drain line 440 of the EL driving TFT 4503 is connected to an anode 447 of an EL element, and a source line 434 of the EL driving TFT 4503 is connected to a power supply line (not shown).

In the present embodiment, as the pixel electrode (anode) 447, a transparent conductive film is used. More specifically, a conductive film made of a compound of indium oxide and zinc oxide is used. It is appreciated that a conductive film made of a compound of indium oxide and tin oxide may be used.

After banks 44a and 44b made of an insulating film are formed, a light-emitting layer 445 made of polyvinylcarbazole is formed by solution coating. On the light-emitting layer 445, a cathode 443 made of an aluminum alloy is formed. In this case, the cathode 443 also functions as a passivation film. Thus, an EL element 3701 is formed.

In the present embodiment, light generated from the light-emitting layer 445 is radiated toward a substrate on which TFTs are formed as represented by an arrow.

Embodiment 7

In the EL display device of the present invention, a material used for an EL layer of an EL element is not limited to an organic EL material, and an inorganic EL material may be used. However, a currently available inorganic EL material has a very high driving voltage, so that a TFT having voltage characteristics that can withstand such a driving voltage must be used.

Alternatively, if an inorganic EL material with a lower driving voltage is developed in the future, such a material can be applied to the present invention.

Embodiment 8

In the present invention, an organic material used as an EL layer may be either a low molecular weight organic material or a polymer (high molecular) organic material. As the low molecular weight organic material, materials are known centering on $Alq_3$ (tris-8-quinolylite-aluminum), TPD (triphenylamine derivative) or the like. As polymer type organic material, π-conjuration polymer materials can be given. Typically, PPV (polyphenylenevynilene), PVK (polyvynilcarbazole), polycarbonate or the like can be given.

The polymer (high molecular) organic material can be formed with a simple thin film formation method such as the spin coating method (which is referred to also as solution application method), the dipping method, the dispense method, the printing method, the ink jet method or the like. The polymer organic material has a high heat resistance compared with the low molecular weight organic material.

Furthermore, in the case where the EL layer incorporated in the EL element of the EL display device according to the present invention has an electron transport layer and a hole transport layer, the electron transport layer and the hole transport layer may be formed of an inorganic material such as, for example, an amorphous semiconductor formed of amorphous Si or amorphous $Si_{1-x}C_x$ or the like.

In the amorphous semiconductor, a large quantity of trap levels are present, and at the same time, the amorphous semiconductor forms a large quantity of interface levels at an interface at which the amorphous semiconductor contacts other layers. As a consequence, the EL element can emit light at a low voltage, and at the same time, an attempt can be made to provide a high luminance.

Besides, a dopant (impurity) is added to the organic EL layer, and the color of light emission of the organic EL layer may be changed. These dopant includes DCM1, nile red, rubren, coumarin 6, TPB and quinaquelidon.

Embodiment 9

Figure 16A:
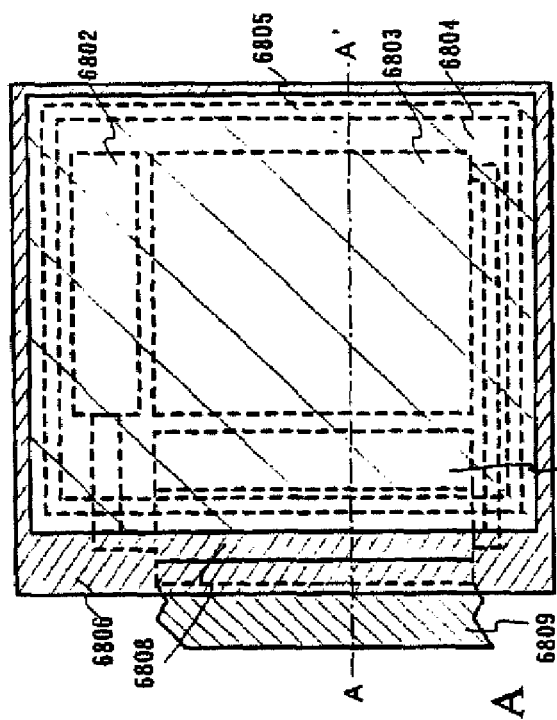
FIGS. 16A and 16B are a top view and a cross-sectional view of the EL display device of the present invention.

In the present embodiment, an exemplary EL display device produced according to the present invention will be described with reference to FIGS. 16A and 16B. FIG. 16A is a top view of an active matrix substrate with an EL element formed thereon, showing a state where an EL element is sealed. A region 6801 represented by a dotted line denotes a source signal line driving circuit, 6802 denotes a gate signal line driving circuit, and 6803 denotes a pixel portion. Furthermore, reference numeral 6804 denotes a cover material, 6805 denotes a first sealant, and 6806 denotes a second sealant. A filler 6807 is provided in a region surrounded by the cover material 6804, the active matrix substrate, and the first sealant 6805 (see FIG. 16B).

Reference numeral 6808 denotes connection wiring for transmitting a signal input to the source signal line driving circuit 6801, the gate signal line driving circuit 6802, and the pixel portion 6803, which receives a video signal and a clock signal from a flexible printed circuit (FPC) 6809 to be a connecting terminal with external equipment.

Figure 16B:
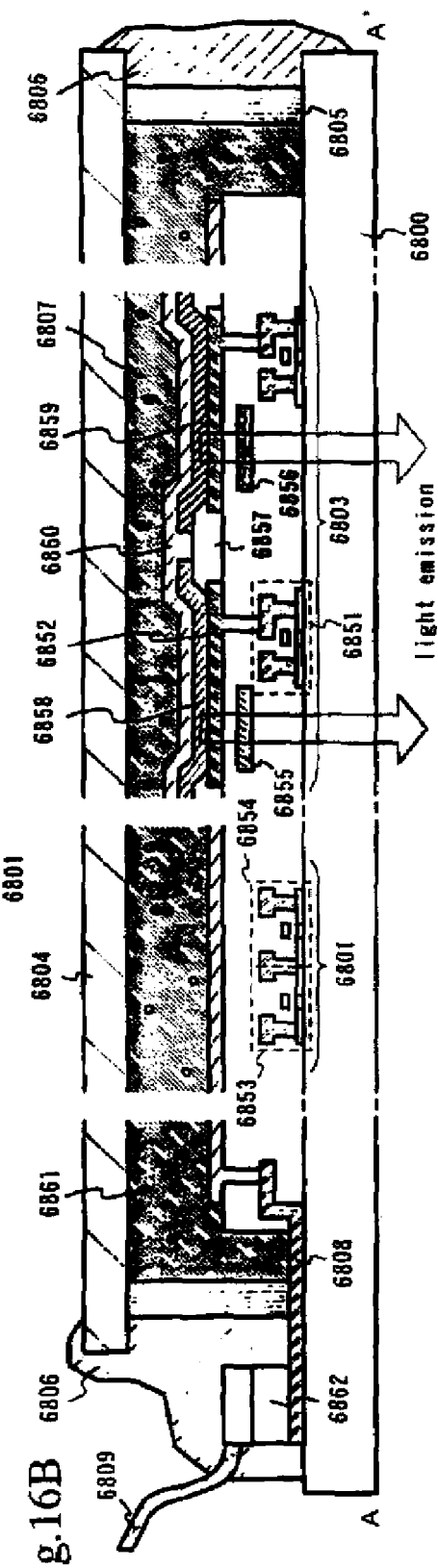

FIG. 16B is a cross-sectional view taken along a line A-A' in FIG. 16A. In these figures, the same components are denoted with the same reference numerals.

As shown in FIG. 16B, the pixel portion 6803 and the source signal line driving signal 6801 are formed on a substrate 6800. The pixel portion 6803 is formed of a plurality of pixels each including an EL driving TFT 6851, a pixel electrode 6852 electrically connected to a drain region thereof, and the like. In the present embodiment, the EL driving TFT 6851 is assumed to be a p-channel type TFT. The source signal line driving circuit 6801 is formed of a CMOS circuit obtained by complementarily combining an n-channel type TFT 6853 and a p-channel type TFT 6854.

Each pixel has a color filter (R) 6855, a color filter (G) 6856 or a color filter (B) (not shown) under its pixel electrode. The color filter (R) is a color filter which extracts red light, the color filter (G) is a color filter which extracts green light, and the color filter (B) is a color filter which extracts blue light. The color filter (R) 6855 is provided in a pixel which emits red, the color filter (G) 6856 is provided in a pixel which emits green, and the color filter (B) is provided in a pixel which emits blue.

The first advantage of the case where these color filters are provided is that the color purity of each emitted color is improved. For example, red light is emitted from the EL element of each pixel which emits red (toward the pixel electrode in the present embodiment), and the purity of red can be improved by passing the red light through the color filter which extracts red light. The other green light and blue light are also subjected to similar processing.

In a conventional structure which does not use color filters, there may occur the problem that visible light which enters from the outside of an EL display device excites the emitting layers of its EL elements and no desired colors can be obtained. However, if color filters are disposed as in the case of Embodiment 9, light with particular wavelength is only allowed to enter the EL elements. That is to say, it is possible to prevent the problem that the EL elements are excited by external light.

Incidentally, although structures provided with color filters have heretofore been proposed, white-emitting EL elements have been used in such structures. In this case, light with the other wavelengths is cut off to extract red light, so that a lowering of luminance is incurred. However, in Embodiment 9, since red light emitted from the EL elements is passed through color filters which extract red light, a lowering of luminance is prevented from being incurred.

The pixel electrode 6852 is formed of a transparent conductive film, and functions as the anode of the EL element. Insulating films 6857 are formed at both ends of the pixel electrode 6852, and in addition, an emitting layer 6858 which emits red light and an emitting layer 6859 which emits green light are formed. Incidentally, although not shown, an emitting layer which emits blue light is provided in an adjacent pixel, whereby color display is provided by the pixels which individually correspond to red, green and blue. Of course, the pixels comprising blue-emitting layers are provided with color filters which extract blue light.

Not only an organic material but also an inorganic material may be used as an EL material. In addition, a stacked structure, in which an electron injection layer, an electron transport layer, a hole transport layer and a hole injection layer are combined, may be adopted.

A cathode 6860 of the EL element is formed of a conductive film with light-shielding characteristics, on each of the emitting layers. This cathode 6860 is common to all the pixels, and is electrically connected to the FPC 6809 via connecting lines 6808.

Then, the first sealing material 6805 is formed with a dispenser or the like, and spacers (not shown) are scattered and the cover material 6804 is stuck. Then, the area which is surrounded by the active matrix substrate 6800, the cover material 6804 and the first sealing material 6805 is filled with the filler 6807 by a vacuum injection method.

In addition, in Embodiment 9, barium oxide is previously added to the filler 6807 as a hygroscopic material 6861. Incidentally, in Embodiment 9, the filler 6807 is a filler containing a hygroscopic material, but the hygroscopic material may also be sealed in the filler in the state of being dispersed in massive form. Although not shown, a hygroscopic material may also be used as the material of spacers.

Then, after the filler 6807 has been cured by irradiation of ultraviolet rays or by heating, an opening (not shown) formed in the first sealing material 6805 is closed. After the openings of the first sealing material 6805 have been closed, the connecting lines 6808 and the FPC 6809 are electrically connected to each other by the use of a conductive material 6862. In addition, a second sealing material 6806 is formed to cover the exposed portion of the first sealing material 6805 and a part of the FPC 6809. The second sealing material 6806 may use the same material as the first sealing material 6805.

By sealing the EL elements with filler 6807 with the use of the above-described method, it is possible to completely isolate the EL elements from the outside, whereby a substance which promotes oxidation of an organic material, such as water or oxygen, can be prevented from penetrating from the outside. Accordingly, it is possible to fabricate a highly reliable EL display device.

Embodiment 10

Figure 17:
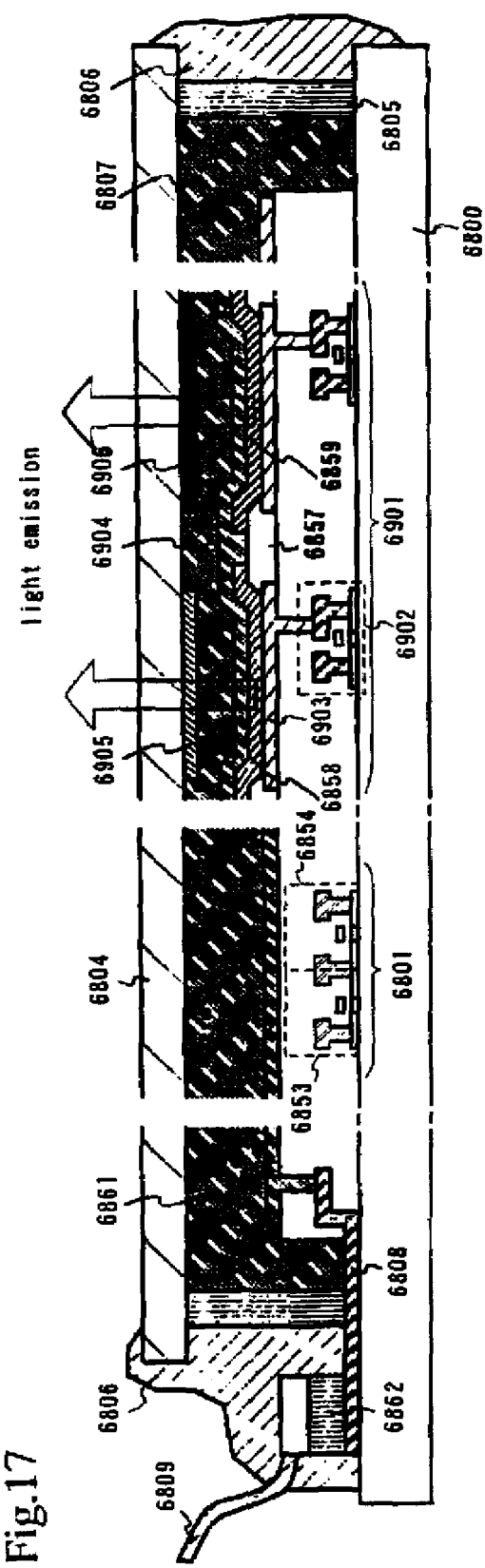
FIG. 17 is a cross-sectional view of the EL display device of the present invention.

In the present embodiment, the case will be described with reference to FIG. 17, in which a radiation direction of light emitted from an EL element and an arrangement of a color filter are changed in the EL display device described in Embodiment 9. The basic configuration in FIG. 17 is the same as that in 16B, so that the description will be made with modified portions denoted with new reference numerals.

A pixel portion 6901 is formed of a plurality of pixels each including an EL driving TFT 6902, a pixel electrode 6903 electrically connected to a drain region thereof, and the like.

In the present embodiment, an n-channel type TFT is used as the EL driving TFT 6902 in the pixel portion 6901. The pixel electrode 6903 is electrically connected to a drain of the EL driving TFT 6902, and the pixel electrode 6903 is made of a conductive film having a light-blocking property. In the present embodiment, the pixel electrode 6903 becomes a cathode of the EL element.

Furthermore, a transparent conductive film 6904 which is common to each pixel is formed on the light-emitting layer 6858 to emit red light and the light-emitting layer 6859 to emit green light. The transparent conductive film 6904 becomes an anode of the EL element.

Furthermore, the present embodiment is characterized in that a color filter (R) 6905, a color filter (G) 6906, and a color filter (B) (not shown) are formed on the cover material 6804. In the case of the configuration of the EL element in the present embodiment, light emitted from a light-emitting layer is radiated toward the cover material 6804 side. Therefore, in the configuration in FIG. 17, a color filter can be disposed in this optical path.

If the color filter (R) 6905, the color filter (G) 6906, and the color filter (B) (not shown) are provided on the cover material 6804 as in the present embodiment, the steps for producing an active matrix substrate can be decreased, and production yield and throughput can be enhanced.

Embodiment 11

In this embodiment, the electronic devices, which incorporates the EL display device manufactured by applying the present invention as the display medium, are explained below.

Such electronic devices include a video camera, a digital camera, a head mounted display (goggle type display), a game machine, a car navigation system, a personal computer, a portable information terminal (a mobile computer, a portable telephone, an electronic book and the like) and the like. Examples of those are shown in FIG. 18.

FIG. 18A shows a personal computer, which contains a main body 2001, a casing 2002, a display portion 2003, a keyboard 2004 and the like. The EL display device of the present invention can be used in the display portion 2003 of the personal computer.

FIG. 18B shows a video camera, which contains a main body 2101, a display portion 2102, a sound input portion 2103, operation switches 2104, a battery 2105, an image receiving portion 2106 and the like. The EL display device of the present invention can be used in the display portion 2102 of the video camera.

FIG. 18C shows a portion (right side) of a head mounted type display device, which contains a main body 2301, a signal cable 2302, a head fixing band 2303, a screen monitor 2304, an optical system 2305, a display portion 2306 and the like. The EL display device of the present invention can be used in the display portion 2306 of the head mounted type EL display device.

FIG. 18D shows an image playback device equipped with a recording medium (specifically, a DVD playback device), which contains a main body 2401, a recording medium (such as a CD, an LD or a DVD) 2402, operation switches 2403, a display portion (a) 2404, a display portion (b) 2405 and the like. The display portion (a) 2404 is mainly used for displaying image information. The display portion (b) 2405 is mainly used for displaying character information. The EL display device of the present invention can be used in the display portions (a) 2404 and (b) 2405 of the image playback device equipped with the recording medium. Note that the present invention can be applied to devices such as a CD playback device and a game machine as the image playback device equipped with the recording medium.

FIG. 18E shows a mobile computer, which contains a main body 2501, a camera portion 2502, an image receiving portion 2503, operation switches 2504, a display portion 2505 and the like. The EL display device of the present invention can be used in the display portion 2505 of the mobile computer.

The applicable range of the present invention is extremely wide, as shown above, and it is possible to apply the present invention to electronic devices in all fields. Further, the electronic devices of this embodiment can be realized using the constitution in which Embodiments 1 to 10 are freely combined.

In an EL display device with a conventional analog gray-scale system, brightness is varied due to the variations in characteristics of TFTs in a pixel portion. Furthermore, in an EL display device with a conventional time gray-scale system, when multi-level gray-scale is exhibited, a display period in a sub-frame period corresponding to a signal of lower order bits is shortened, and it becomes difficult to continue to apply a constant EL driving voltage. When an environment temperature to be used is changed, the amount of current flowing through the EL element is varied and variations in brightness are caused due to the temperature characteristics of an EL element even if the same voltage is applied to the EL element.

However, according to the present invention, variations in brightness of the EL element can be suppressed with the above-mentioned configuration. Thus, an EL display device with high image quality can be provided.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A light emitting device comprising:
a first light emitting element formed over a substrate, the first light emitting element comprising a first electrode and a second electrode with a first light emitting material interposed therebetween;
a second light emitting element comprising a third electrode and a fourth electrode with the first light emitting material interposed therebetween;
a plurality of constant current sources; and
a switch which is arranged to connect the third electrode to one of the plurality of constant current sources,
wherein the third electrode is electrically connected to the first electrode through a power source line.

2. The light emitting device according to claim 1, wherein the second electrode and the fourth electrode are connected to be supplied with the same constant potential.

3. The light emitting device according to claim 1, wherein the second light emitting element is formed over the substrate.

4. The light emitting device according to claim 1, wherein the plurality of constant current sources are formed over the substrate.

5. The light emitting device according to claim 1, wherein the plurality of constant current sources are formed over a single crystal IC chip.

6. The light emitting device according to claim 1, wherein the first light emitting element emits white light.

7. The light emitting device according to claim 1, wherein the plurality of constant current sources are capable of supplying constant current to the second light emitting element regardless of a change in ambient temperature.

8. A light emitting device comprising:
a first light emitting element formed over a substrate, the first light emitting element comprising a first electrode and a second electrode with a first light emitting material interposed therebetween;
a second light emitting element comprising a third electrode and a fourth electrode with the first light emitting material interposed therebetween;
a plurality of constant current sources; and
a switch which is arranged to connect the third electrode to one of the plurality of constant current sources,
wherein the third electrode is electrically connected to the first electrode through a buffer amplifier and a power source line.

9. The light emitting device according to claim 8, wherein the second electrode and the fourth electrode are connected to be supplied with the same constant potential.

10. The light emitting device according to claim 8, wherein the second light emitting element is formed over the substrate.

11. The light emitting device according to claim 8, wherein the plurality of constant current sources are formed over the substrate.

12. The light emitting device according to claim 8, wherein the plurality of constant current sources are formed over a single crystal IC chip.

13. The light emitting device according to claim 8, wherein the plurality of constant current sources are capable of supplying constant current to the second light emitting element regardless of a change in ambient temperature.

14. The light emitting device according to claim 8, wherein the first light emitting element emits white light.

15. An electronic device having a light emitting portion, the light emitting portion comprising:
a first light emitting element formed over a substrate, the first light emitting element comprising a first electrode and a second electrode with a first light emitting material interposed therebetween;
a second light emitting element comprising a third electrode and a fourth electrode with the first light emitting material interposed therebetween;
a plurality of constant current sources; and
a switch which is arranged to connect the third electrode to one of the plurality of constant current sources,
wherein the third electrode is electrically connected to the first electrode through a power source line.

16. The electronic device according to claim 15, wherein the second electrode and the fourth electrode are connected to be supplied with the same constant potential.

17. The electronic device according to claim 15, wherein the second light emitting element is formed over the substrate.

18. The electronic device according to claim 15, wherein the plurality of constant current sources are formed over the substrate.

19. The electronic device according to claim 15, wherein the plurality of constant current sources are formed over a single crystal IC chip.

20. The electronic device according to claim 15, wherein the plurality of constant current sources are capable of supplying constant current to the second light emitting element regardless of a change in ambient temperature.

21. The electronic device according to claim 15, wherein the first light emitting element emits white light.

22. The electronic device according to claim 15, wherein the electronic device is selected from a video camera, a digital camera, a head mounted display, a game machine, a navigation system, a personal computer, and a portable information terminal.

23. An electronic device having a light emitting portion, the light emitting portion comprising:
a first light emitting element formed over a substrate, the first light emitting element comprising a first electrode and a second electrode with a first light emitting material interposed therebetween;
a second light emitting element comprising a third electrode and a fourth electrode with the first light emitting material interposed therebetween;
a plurality of constant current sources; and
a switch which is arranged to connect the third electrode to one of the plurality of constant current sources,
wherein the third electrode is electrically connected to the first electrode through a buffer amplifier and a power source line.

24. The electronic device according to claim 23, wherein the second electrode and the fourth electrode are connected to be supplied with the same constant potential.

25. The electronic device according to claim 23, wherein the second light emitting element is formed over the substrate.

26. The electronic device according to claim 23, wherein the plurality of constant current sources are formed over the substrate.

27. The electronic device according to claim 23, wherein the plurality of constant current sources are formed over a single crystal IC chip.

28. The electronic device according to claim 23, wherein the plurality of constant current sources are capable of supplying constant current to the second light emitting element regardless of a change in ambient temperature.

29. The electronic device according to claim 23, wherein the first light emitting element emits white light.

30. The electronic device according to claim 23, wherein the electronic device is selected from a video camera, a digital camera, a head mounted display, a game machine, a navigation system, a personal computer, and a portable information terminal.

* * * * *